US012805005B2

(12) United States Patent
Lu et al.

(10) Patent No.: US 12,805,005 B2
(45) Date of Patent: Nov. 17, 2026

(54) TRANSISTOR STRUCTURE AND FORMATION METHOD THEREOF

(71) Applicant: Invention And Collaboration Laboratory Pte. Ltd., Singapore (SG)

(72) Inventors: Chao-Chun Lu, Singapore (SG); Li-Ping Huang, Singapore (SG); Wen-Hsien Tu, Singapore (SG)

(73) Assignee: Invention And Collaboration Laboratory Pte. Ltd., Singapore (SG)

(*) Notice: Subject to any disclaimer, the term of this patent is extended or adjusted under 35 U.S.C. 154(b) by 416 days.

(21) Appl. No.: 18/472,233

(22) Filed: Sep. 22, 2023

(65) Prior Publication Data

US 2024/0105846 A1 Mar. 28, 2024

Related U.S. Application Data

(60) Provisional application No. 63/409,243, filed on Sep. 23, 2022.

(51) Int. Cl.

*H10D 84/85* (2025.01)
*H10B 12/00* (2023.01)
*H10D 30/60* (2025.01)
*H10D 30/69* (2025.01)
*H10D 62/00* (2025.01)

(Continued)

(52) U.S. Cl.

CPC ......... *H10D 84/854* (2025.01); *H10B 12/033* (2023.02); *H10B 12/315* (2023.02); *H10D 30/605* (2025.01); *H10D 30/792* (2025.01); *H10D 30/797* (2025.01); *H10D 62/021* (2025.01); *H10D 62/116* (2025.01); *H10D 62/154* (2025.01); *H10D 62/158* (2025.01); *H10D 62/371* (2025.01); *H10D 64/256* (2025.01); *H10D 84/85* (2025.01)

(58) Field of Classification Search

None

See application file for complete search history.

(56) References Cited

U.S. PATENT DOCUMENTS 5,463,241 A * 10/1995 Kubo ................. H10D 30/0323 257/376
11,289,574 B2 3/2022 Hsu et al.

(Continued)

OTHER PUBLICATIONS

"Office Action of Taiwan Counterpart Application", issued on Apr. 9, 2025, p. 1-p. 10.

(Continued)

*Primary Examiner* — Nicholas J Tobergte
(74) *Attorney, Agent, or Firm* — JCIPRNET

(57) ABSTRACT

A transistor structure and a formation method thereof are provided. The transistor structure includes a transistor device, formed on an active region of a semiconductor substrate, and including: a gate structure, disposed on the active region; gate spacers, formed along opposite sidewalls of the gate structure; source/drain structures, formed in recesses of the active region at opposite sides of the gate structure; and buried isolation structures, separately extending along bottom sides of the source/drain structures. Further, a channel portion of the active region between the source/drain structures is strained as a result of a strained etching stop layer lying above or dislocation stressors formed in the source/drain structures.

13 Claims, 40 Drawing Sheets

(51) Int. Cl.

| | |
|---|---|
| ***H10D 62/10*** | (2025.01) |
| ***H10D 62/13*** | (2025.01) |
| ***H10D 62/17*** | (2025.01) |
| ***H10D 64/23*** | (2025.01) |

(56) References Cited

U.S. PATENT DOCUMENTS

| | | | | |
|---|---|---|---|---|
| 2003/0102499 | A1* | 6/2003 | Fujiwara | H10D 30/6743 257/E29.147 |
| 2009/0224328 | A1* | 9/2009 | Ting | H10D 30/797 257/E21.409 |
| 2012/0256264 | A1* | 10/2012 | Haneda | H01L 21/76272 438/296 |
| 2016/0035891 | A1* | 2/2016 | Xu | H10D 64/017 257/288 |
| 2018/0012962 | A1 | 1/2018 | Yeh et al. | |

OTHER PUBLICATIONS

"Office Action of Taiwan Counterpart Application", issued on Aug. 29, 2024, p. 1-p. 5.

* cited by examiner

TRANSISTOR STRUCTURE AND FORMATION METHOD THEREOF

CROSS-REFERENCE TO RELATED APPLICATION

This application claims the priority benefit of provisional application Ser. No. 63/409,243, filed on Sep. 23, 2022. The entirety of the above-mentioned provisional application is hereby incorporated by reference herein and made a part of this specification.

BACKGROUND

Technical Field

The present disclosure relates to a semiconductor structure and a manufacturing method thereof, and particularly, to a transistor structure and a manufacturing method thereof.

DESCRIPTION OF RELATED ART

Along with fast development of complementary metal-oxide-semiconductor (CMOS) technology in recent decades, feature size of the transistor structure in CMOS circuit has been continuously scaled down for greater integration density and faster switching operation. However, such miniaturization is accompanied with several issues, such as short channel effect (SCE) and latch-up. As a consequence of these issues, reliability of CMOS circuit may be compromised. In order to minimize impacts resulted from these issues, it is common to reserve longer channel length and longer isolation width, but further scaling of CMOS circuit is therefore limited.

SUMMARY

In an aspect of the present disclosure, a transistor structure is provided. The transistor structure comprises: a first transistor device, formed on a first active region of a semiconductor substrate, and comprises: a first gate structure, disposed on the first active region; first gate spacers, formed along opposite sidewalls of the first gate structure; first source/drain structures, formed in recesses of the first active region at opposite sides of the first gate structure; first buried isolation structures, separately extending along bottom sides of the first source/drain structures; and a first strained etching stop layer, covering the first source/drain structures, the first gate spacers and the first gate structure, and formed with tensile or compressive stressors.

In some embodiments, the first source/drain structures are in lateral contact with straight sidewalls of the recesses that are substantially aligned with the sidewalls of the first gate structure.

In some embodiments, the first source/drain structures are grown from curved or depressed sidewalls of the recesses.

In some embodiments, the first active region is a fin structure defined at a top surface of the semiconductor substrate, and the first gate structure crosses the first active region, such that the first active region is in contact with the first gate structure by a top surface and opposite sidewalls.

In some embodiments, the first buried isolation structures respectively comprise a first localized isolation layer and a second localized isolation layer, the first localized isolation layer lies under the second localized isolation layer, and further extends to be in lateral contact with an edge of the second localized isolation layer and in contact with the overlying one of the first source/drain structures from below.

In some embodiments, each of the first source/drain structures is grown from a single crystalline plane of the first active region.

In some embodiments, the first transistor device is an N-type MOSFET, the first strained etching stop layer is formed with tensile stressors, and the transistor structure further comprises: a second transistor device as a P-type MOSFET, formed on a second active region of the semiconductor substrate. The second transistor device comprises: a second gate structure; second gate spacers, formed along opposite sidewalls of the second gate structure; second source/drain structures, formed in recesses of the second active region at opposite sides of the second gate structure; second buried isolation structures, formed in the second active region, and separately extending along bottom sides of the second source/drain structures; and a second strained etching stop layer, covering the second source/drain structures, the second gate spacers and the second gate structure, and formed with compressive stressors.

In some embodiments, the first and second strained etching stop layers are both formed of silicon nitride.

In some embodiments, the transistor structure further comprises: a trench isolation structure, formed into the semiconductor substrate, and laterally surrounding each of the first and second active regions.

In some embodiments, a top surface of the trench isolation structure is higher than topmost surfaces of the first and second active regions.

In another aspect of the present disclosure, a transistor structure is provided. The transistor structure comprises: a transistor device, formed on an active region of a semiconductor substrate, and comprising: a gate structure; gate spacers, formed along opposite sidewalls of the gate structure; source/drain structures, filled in recesses of the active region at opposite sides of the gate structure, and respectively comprising a first semiconductor region and a second semiconductor region, wherein the first semiconductor region is in lateral contact with a sidewall of one recess and the second semiconductor region laterally extends from the first semiconductor region and is formed with dislocation stressors; and buried isolation structures, formed along bottom sides of the recesses, and are laterally separated from each other.

In some embodiments, the dislocation stressors result in tensile stress or compressive stress in a channel portion of the active region between the source/drain structures.

In some embodiments, a doping concentration in the first semiconductor region is lower than a doping concentration in the second semiconductor region.

In a further aspect of the present disclosure, a method for forming a transistor structure is provided. The method comprises: providing a semiconductor substrate; defining an active region in the semiconductor substrate; forming a gate structure based on the active region; forming gate spacers along opposite sidewalls of the gate structure; forming recesses into the active region along outer sidewalls of the gate spacers; forming localized isolation layers in the recesses, respectively; removing portions of localized isolation layers to expose sidewalls of the recesses; growing source/drain structures from the exposed sidewalls of the recesses; and subjecting a channel portion of the active region between the source/drain structure to tensile or compressive stress.

In some embodiments, the step of subjecting the channel portion of the active region tensile stress or compressive comprises: forming a strained etching stop layer with tensile or compressive stressors over the source/drain structures, the gate spacers and the gate structure.

In some embodiments, the step of subjecting the channel portion of the active region to tensile stress comprises: performing an ion implantation process on the source/drain structures, to result in amorphization of the source/drain structures; forming a capping layer on the source/drain structures; performing an annealing process, so as the source/drain structures are recrystallized and formed with dislocation stressors; and removing the capping layer.

In some embodiments, the method further comprises: laterally recessing the exposed sidewalls of the recesses to be curved or depressed sidewalls after removing the portions of the localized isolation layers and before growth of the source/drain structures.

In some embodiments, the method further comprises: forming pad layers on the active regions before formation of the gate structure and the gate spacers; and forming a gate opening through the pad layers, wherein the gate structure is subsequently filled in the gate opening.

In some embodiments, the gate spacers are formed along opposite sidewalls of the gate opening before the gate structure is filled in the gate opening.

In some embodiments, the active region is a fin structure defined at a surface of the semiconductor substrate, and is in contact with the gate structure by a top surface and opposite sidewalls.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

A transistor structure manufacture process and a resulted transistor structure are provided in the present disclosure, for addressing the SCE and latch-up issues without reserving excessive spare channel length or wasting too much isolation area, and for further enhancing operation speed in respective metal-oxide-semiconductor field effect transistors (MOSFETs) in the transistor structure. Such transistor structure can be applied in any logic circuit or memory circuit. As an example (but not limited to), the transistor structure can be used in a driving circuit of a memory array.

Figure 1:
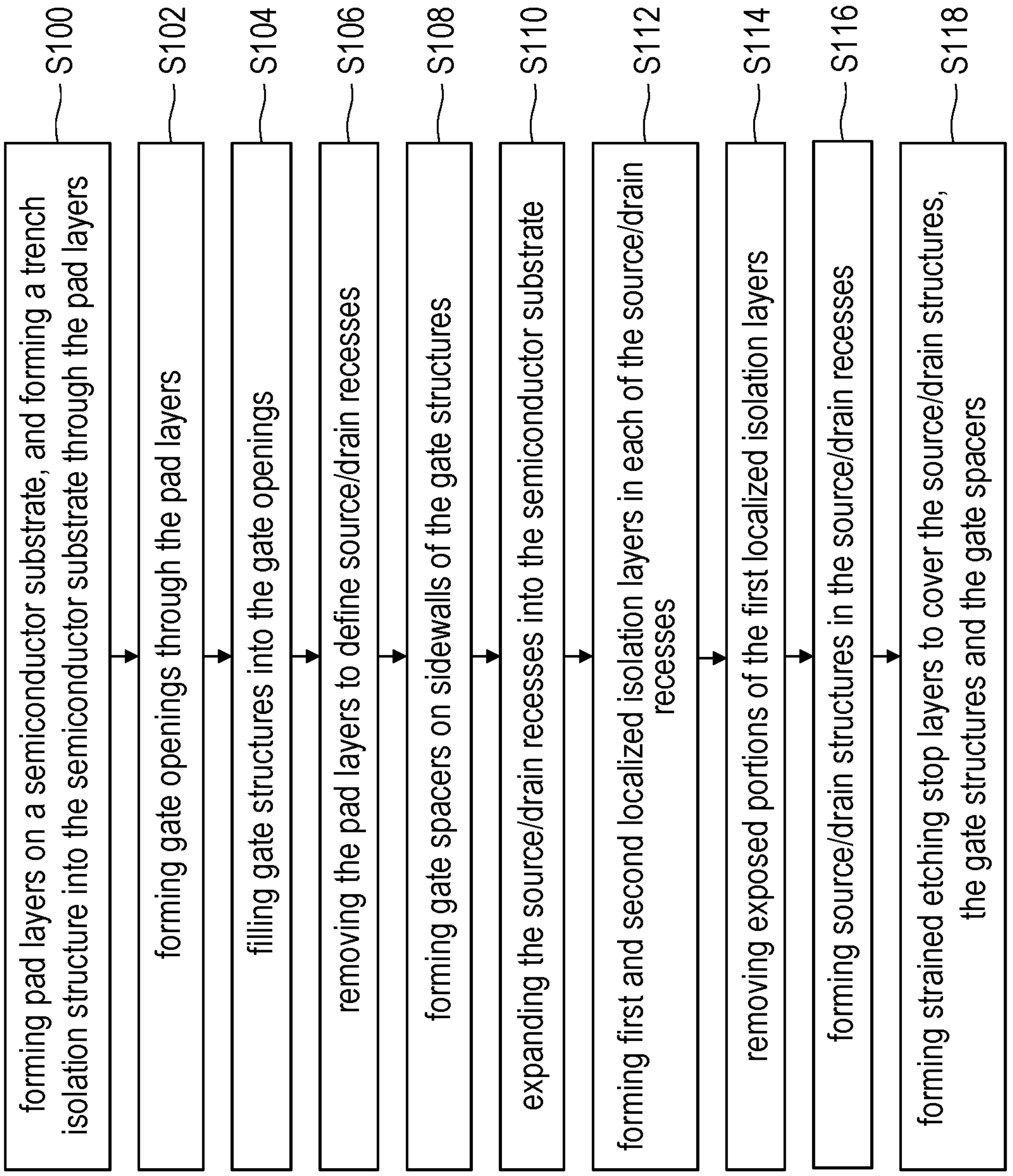
FIG. 1 is a flow diagram illustrating a method for forming a transistor structure, according to some embodiments of the present disclosure.
Figure 2A:
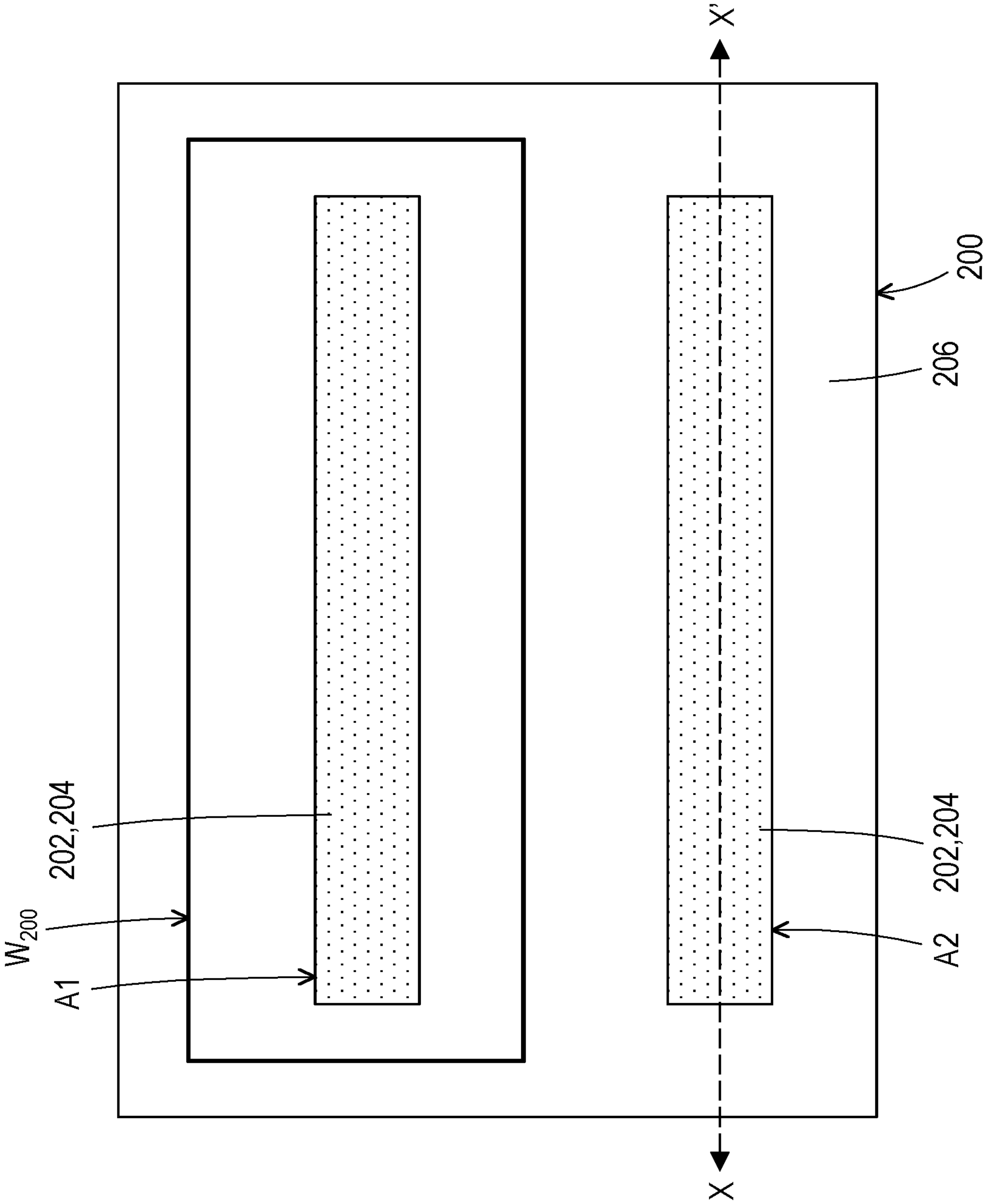
FIG. 2A through FIG. 2T illustrate structures at a serios of stages during the process shown in FIG. 1.

FIG. 1 is a flow diagram illustrating a method for forming a transistor structure, according to some embodiments of the present disclosure. FIG. 2A through FIG. 2T illustrate structures at a serios of stages during the process shown in FIG. 1. Particularly, FIG. 2A, FIG. 2C, FIG. 2E, FIG. 2G, FIG. 2I, FIG. 2K, FIG. 2M, FIG. 2O, FIG. 2Q and FIG. 2S show schematic plan views of these structures, and FIG. 2B, FIG. 2D, FIG. 2F, FIG. 2H, FIG. 2K, FIG. 2L, FIG. 2N, FIG. 2P, FIG. 2R and FIG. 2T are respectively a schematic cross-sectional view along an X-X' line shown in the previous schematic plan view (e.g., FIG. 2B is a cross-sectional view along the X-X' line shown in FIG. 2A).

Figure 2B:
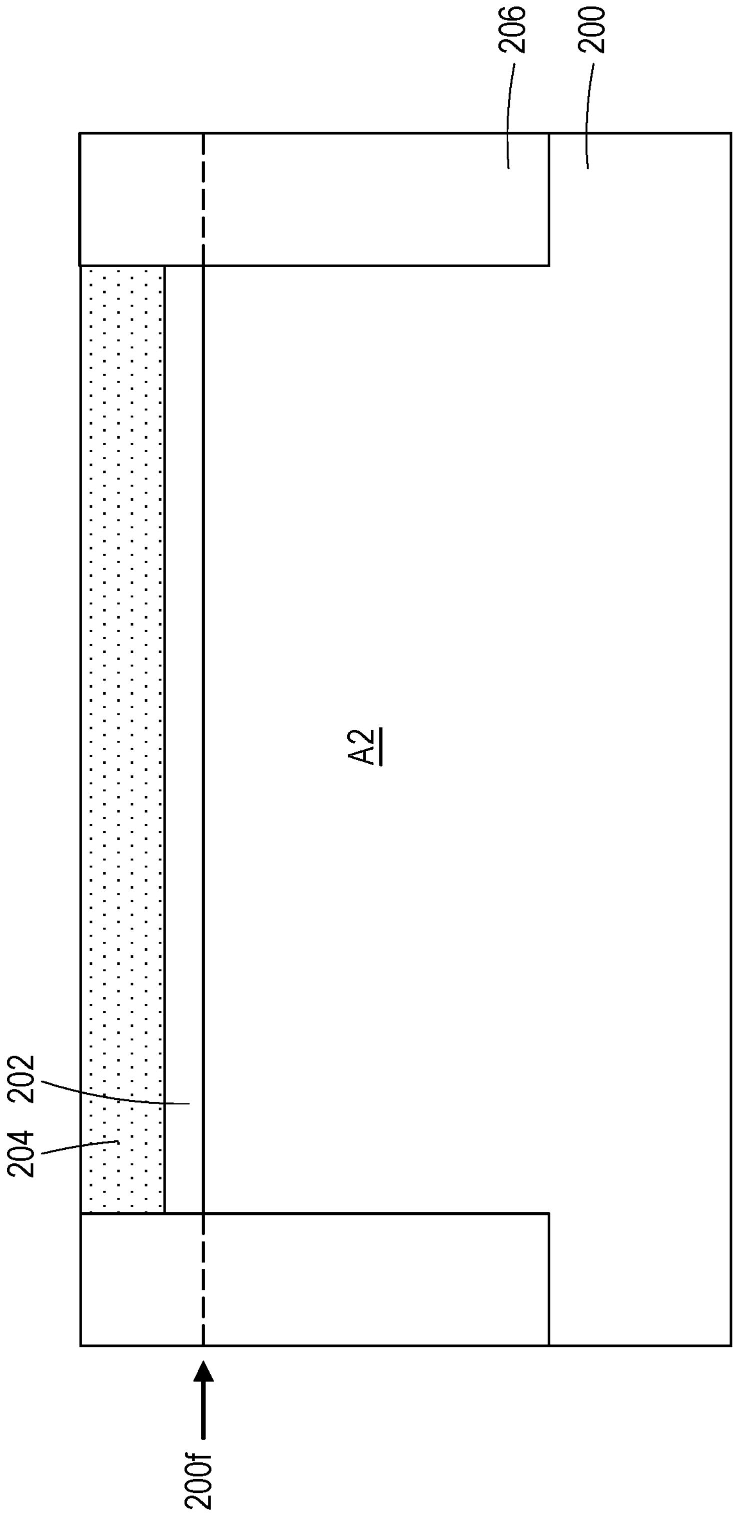

Referring to FIG. 1, FIG. 2A and FIG. 2B, at a step S100, pad layers 202, 204 are sequentially formed on a semiconductor structure 200, and a trench isolation structure 206 is formed into the semiconductor substrate 200 through the pad layers 202, 204. As shown in FIG. 2A, the trench isolation structure 206 defines an active region A1 of a P-type MOSFET (PMOS) and an active region A2 of an N-type MOSFET (NMOS). Stacks of the remained pad layers 202, 204 are laterally surrounded by the trench isolation structure 206, and cover the active regions A1, A2, respectively. In an example that the semiconductor substrate 200 is a P-type semiconductor substrate, the active region A1 of the PMOS may be located in an N-type well $W_{200}$ formed into the semiconductor substrate 200, whereas the active region A2 of the NMOS may be located outside the N-type well $W_{200}$.

As shown in FIG. 2B, the trench isolation structure 206 extends into the semiconductor substrate 200 from a top surface of the pad layer 204, which is elevated from an original semiconductor surface (OSS) 200*f* of the semiconductor substrate 200. As a result of a possible planarization process, a top surface of the trench isolation structure 206 may be substantially coplanar with the top surface of the pad layer 204. In addition, a total thickness of the pad layers 202, 204 may be substantially identical with a thickness of a protruding portion of the trench isolation structure 206 (protruding with respect to the OSS 200*f* of the semiconductor substrate 200). According to some embodiments, the pad layer 202 is formed of silicon oxide, whereas the pad layer 204 is formed of silicon nitride.

Figure 2C:
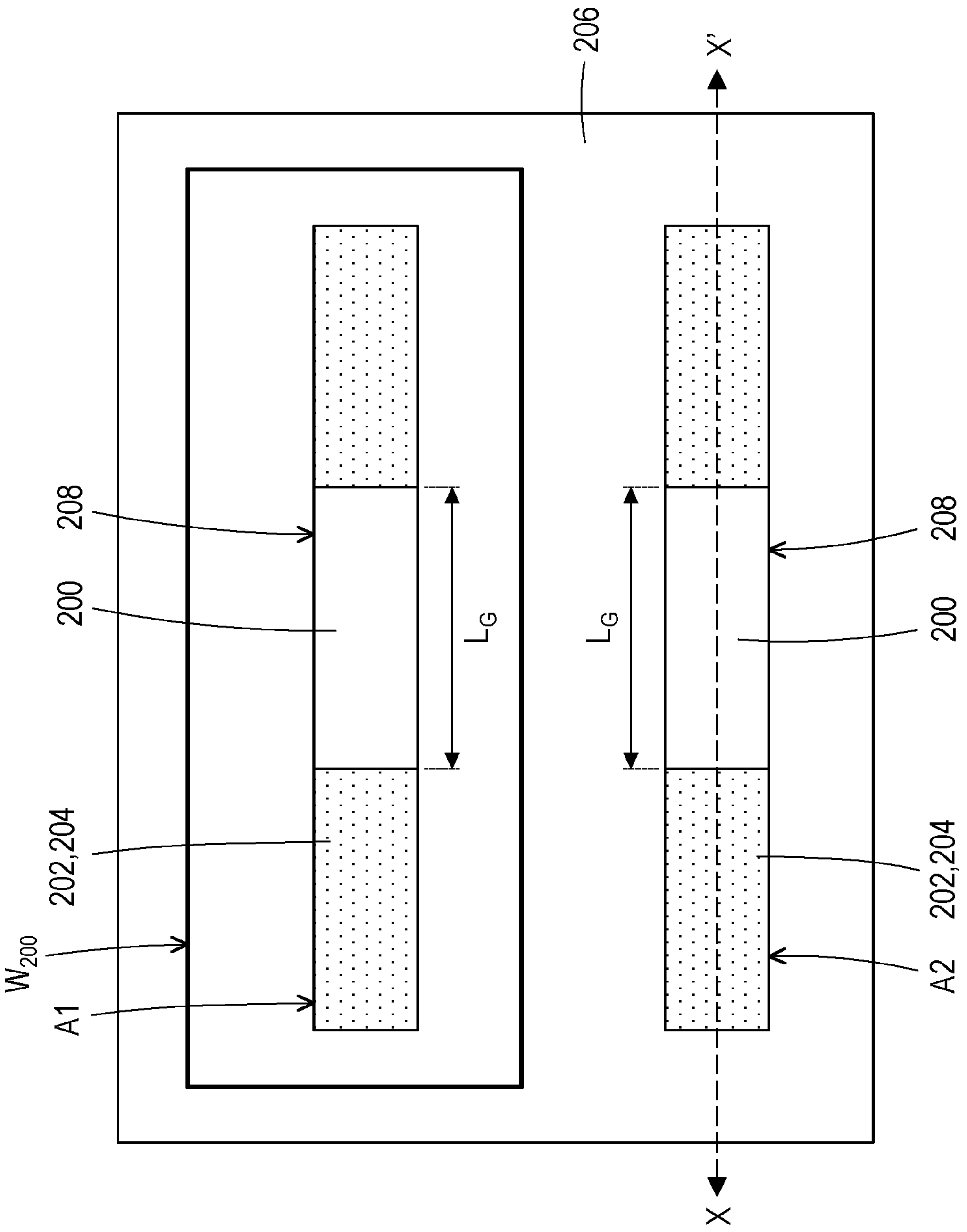
Figure 2D:
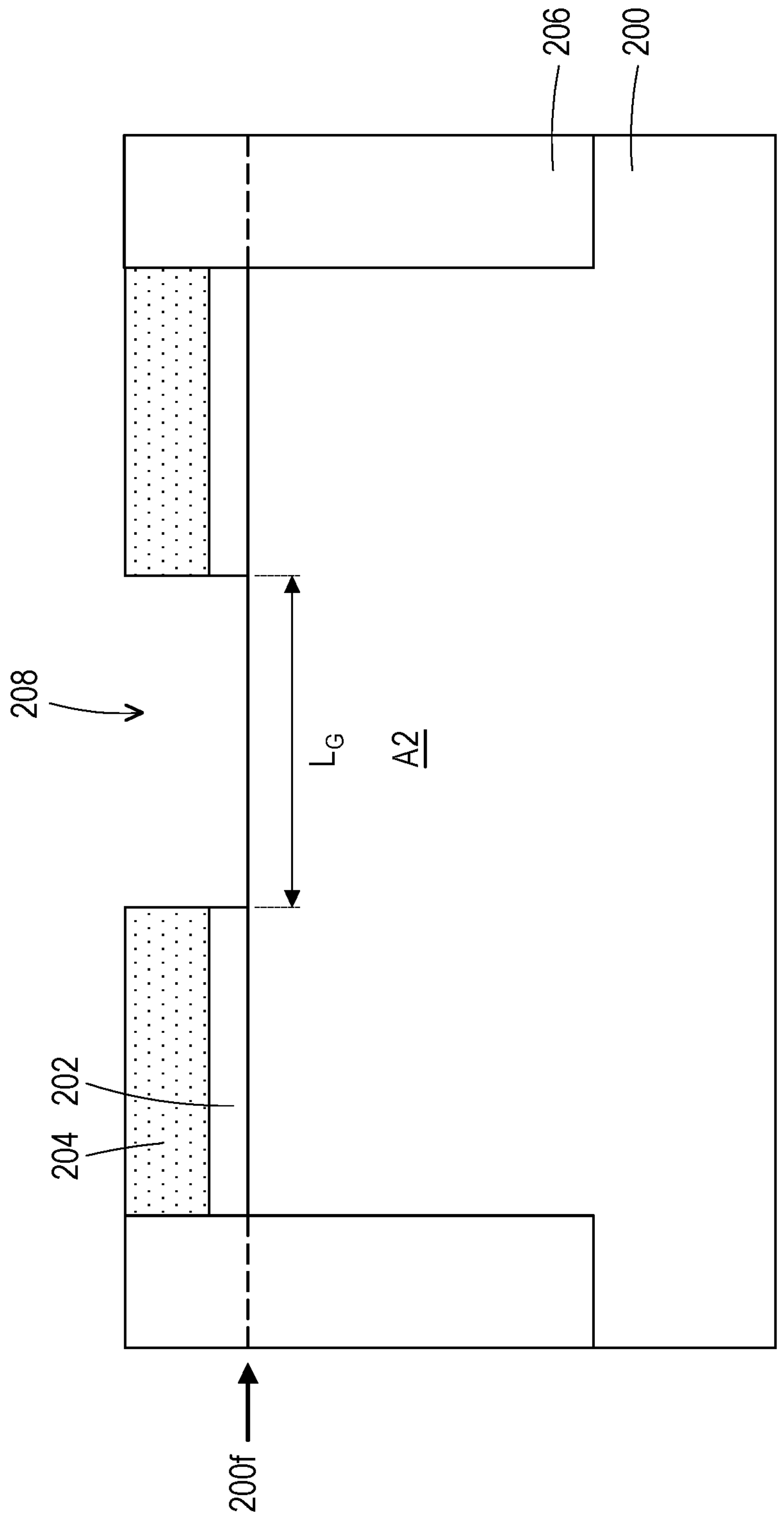

Referring to FIG. 1, FIG. 2C and FIG. 2D, at a step S102, gate openings 208 are formed through the stacks of the pad layers 202, 204, to expose portions of the active regions A1, A2 defined in the semiconductor substrate 200. A first side and a second side of each gate opening 208 are defined by the penetrated pad layers 202, 204, and a third side as well as fourth side of each gate opening 208 are defined by the surrounding trench isolation structure 206. In a following step, gate structures (i.e., the gate structures 210 shown in FIG. 2E and FIG. 2F) will be filled in the gate openings 208. In this way, a length of each gate opening 208 defines a gate length L G of the accommodated gate structure, which will further define a channel length of the sitting PMOS/NMOS. Also, a width and a depth of each gate opening 208 define a gate width and a gate height of the accommodated gate structure, respectively.

Figure 2E:
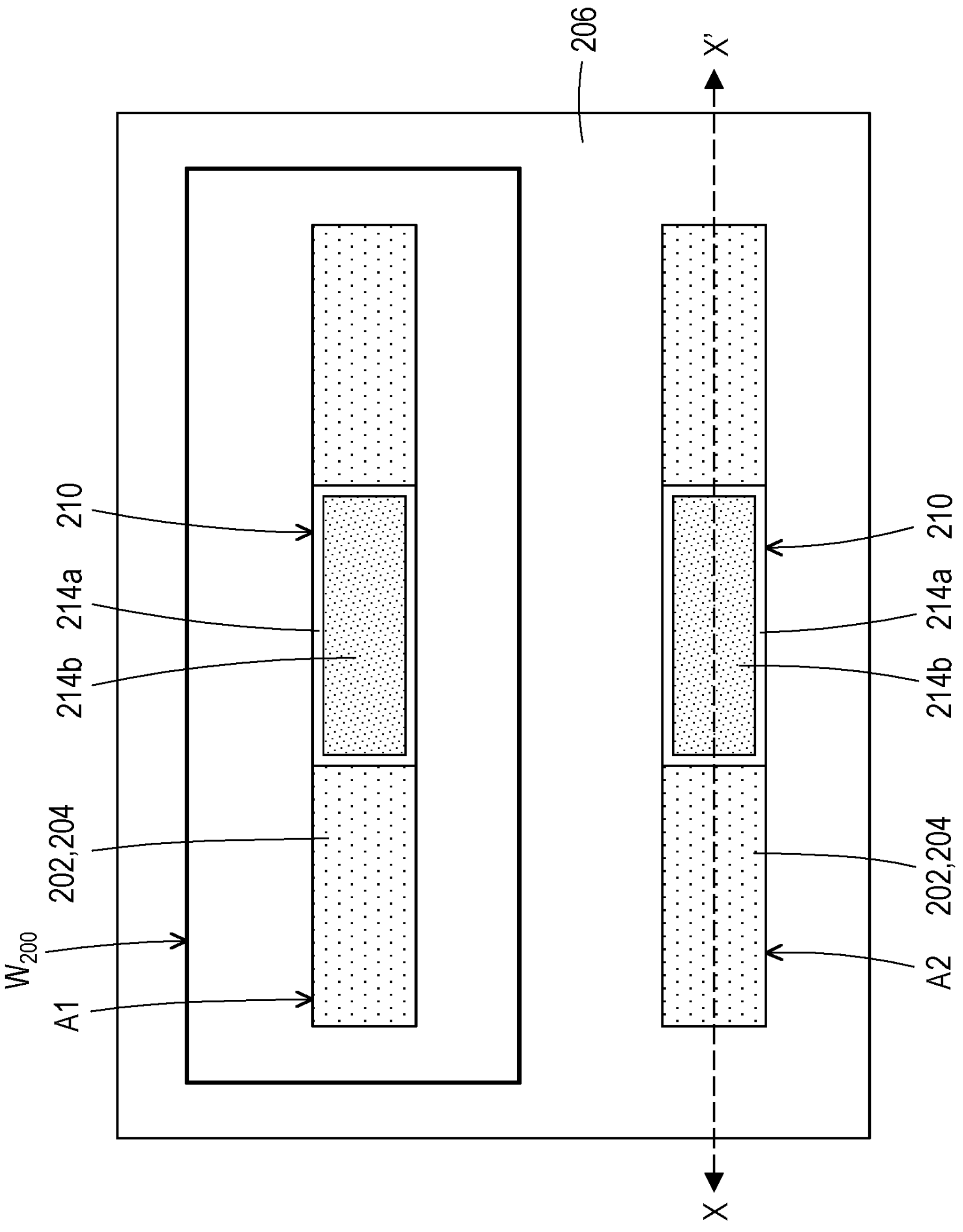
Figure 2F:
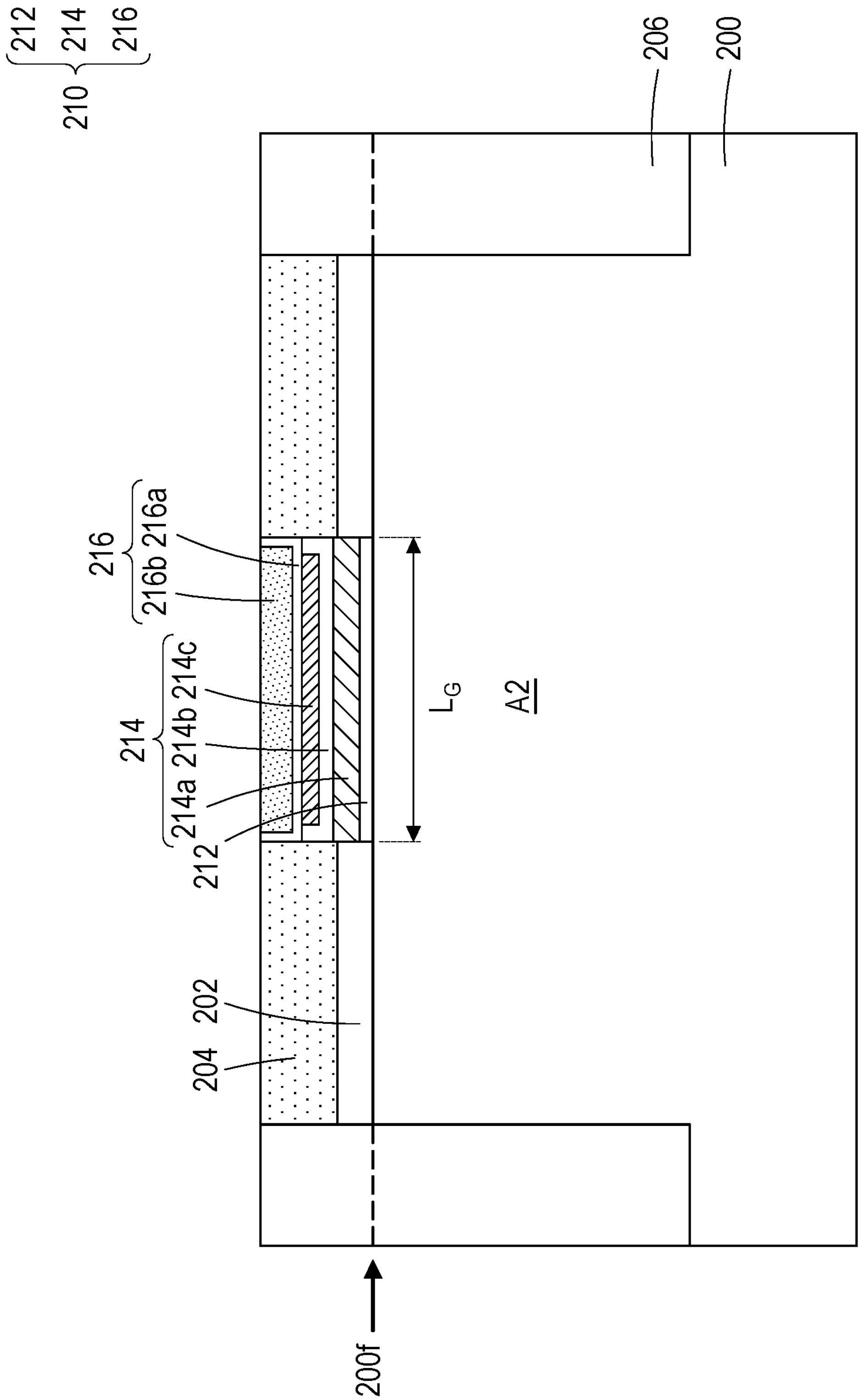

Referring to FIG. 1, FIG. 2E and FIG. 2F, at a step S104, gate structures 210 are filled in the gate openings 208, respectively. As described, dimensions of the gate structures 210 are defined by the dimensions of the gate openings 208. Further, the gate structures 210 filled in the pre-defined gate openings 208 are already separated from one another. There is no need to perform a further patterning process on the resulted gate structures 210, which generally involves a combination of a lithography process and a plasma etching process. As the gate structures 210 are filled in pre-defined openings, a process for forming the gate structures 210 may be referred to as a damascene gate process.

Each gate structure 210 may include a gate dielectric layer 212, a gate electrode 214 stacked on the gate dielectric layer 212 and an insulating cap 216 covering the gate electrode 214. The gate dielectric layers 212 are formed along the exposed surfaces of the active regions A1, A2 in the gate openings 208. As shown in FIG. 2F, the gate dielectric layers 212 respectively line along a bottom surface of the accommodating gate opening 208. According to some embodiments, the gate dielectric layers 212 are formed of silicon oxide, and a thermal oxidation process may be involved for forming the gate dielectric layers 212. In other embodiments, the gate dielectric layers 212 are formed of a high dielectric constant (high-k) dielectric material, and a chemical vapor deposition (CVD) process may be involved for forming the gate dielectric layers 212.

In one embodiment, each gate electrode 214 may include a first conductive layer 214*a*, a second conductive layer 214*b* and a third conductive layer 214*c*. The first conductive layer 214*a* is stacked on the underlying gate dielectric layer 212, and may be formed of polysilicon. In addition, the second conductive layer 214*b* in a recess shape covers a top surface of the first conductive layer 214*a* and further extends along sidewalls of the accommodating gate opening 208, and may be formed of titanium, titanium nitride or a combination thereof. Further, the third conductive layer 214*c* is filled in the recess defined by the second conductive layer 214*b*, and may be formed of a metallic material, such as tungsten.

The gate electrodes 214 may be formed to a height lower than top ends of the gate openings 208, which may be defined by top surfaces of the pad layer 204. A method for forming the first conductive layers 214*a* may involve a deposition process and an etch back process. In addition, initial layers for forming the second and third conductive layers 214*b*, 214*c* may be sequentially deposited, then a planarization process may be performed to remove portions of the initial layers over the pad layers 204. Further, another etch back process may be performed to recess these initial layers, and remained portions of these initial layers form the second and third conductive layers 214*b*, 214*c*.

The insulating caps 216 are provided on the gate electrodes 214, to fill up the gate openings 208. According to some embodiments, each insulating cap 216 includes a first insulating layer 216*a* and a second insulating layer 216*b* covering the first insulating layer 216*a*.

Figure 2G:
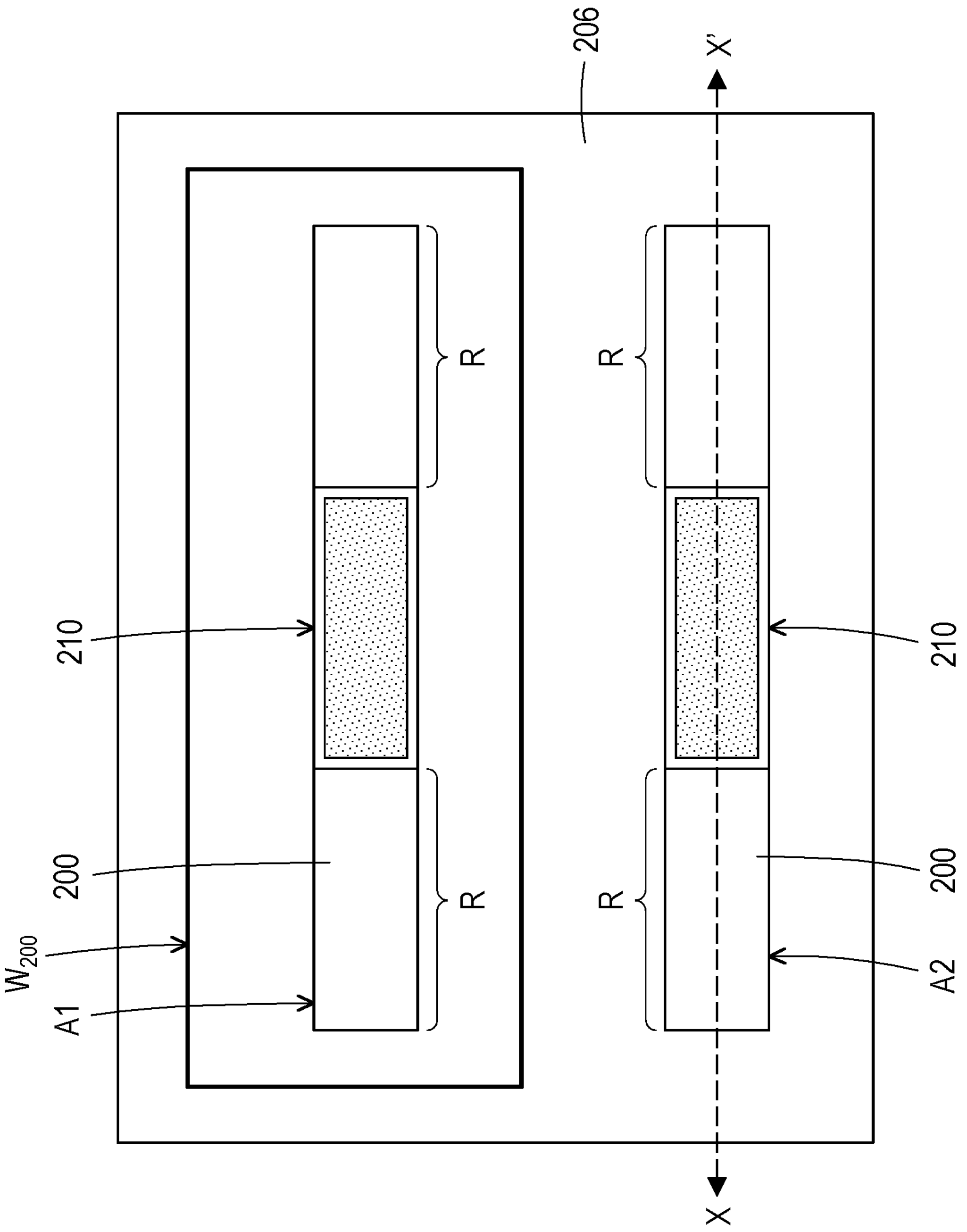
Figure 2H:
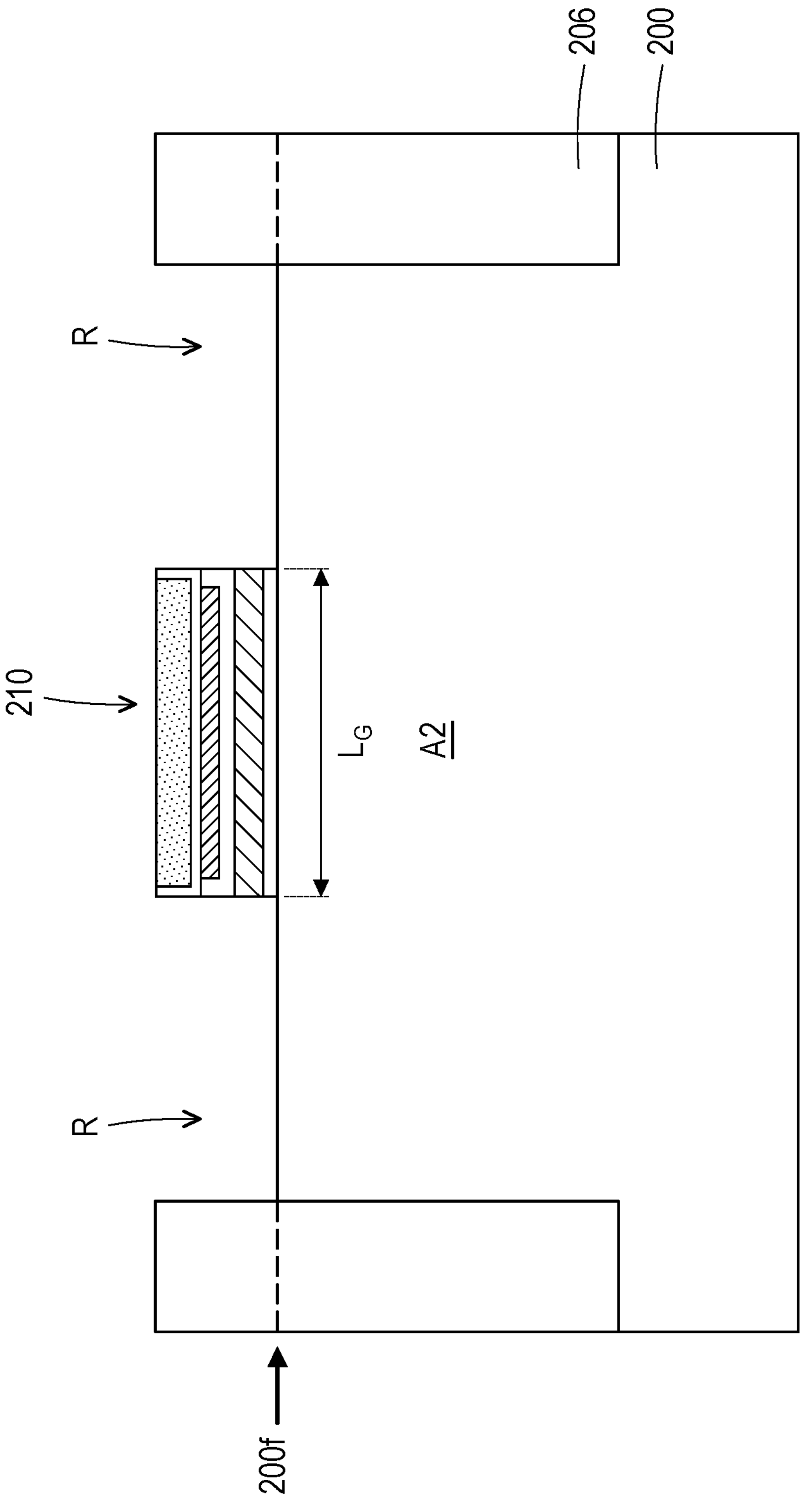

Referring to FIG. 1, FIG. 2G and FIG. 2H, at a step S106, the pad layers 202, 204 are removed to define source/drain recesses R at opposite sides of each gate structure 210. Sidewalls of each source/drain recess R are defined by the surrounding trench isolation structure 206 and gate structure 210, and a bottom surface of each source/drain recess R is defined by an exposed surface of the underlying active region A1/A2. In following steps, the source/drain recesses R will extend deeper into the active regions A1, A2, and source/drain structures will be filled in the source/drain recesses R.

Figure 2I:
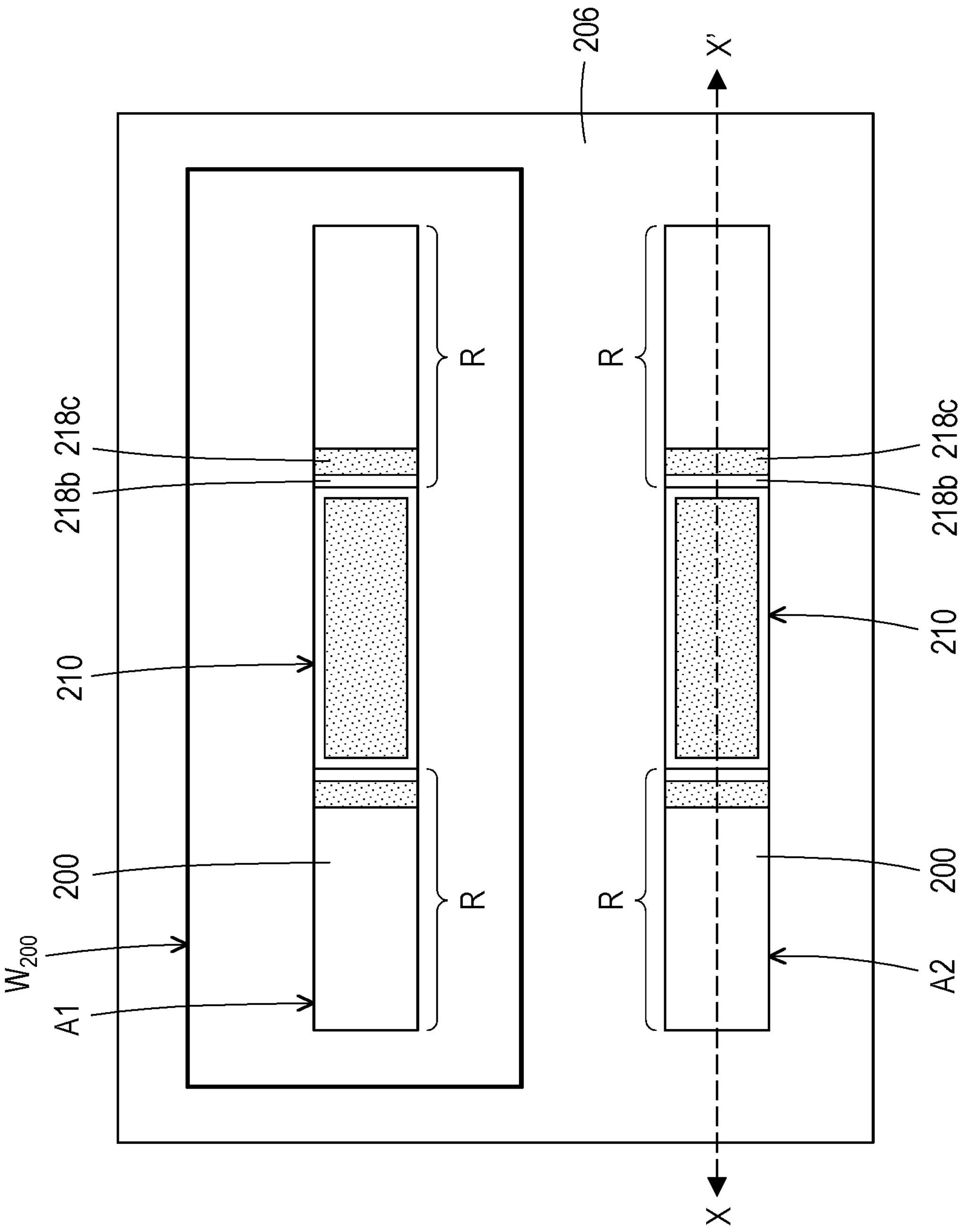
Figure 2J:
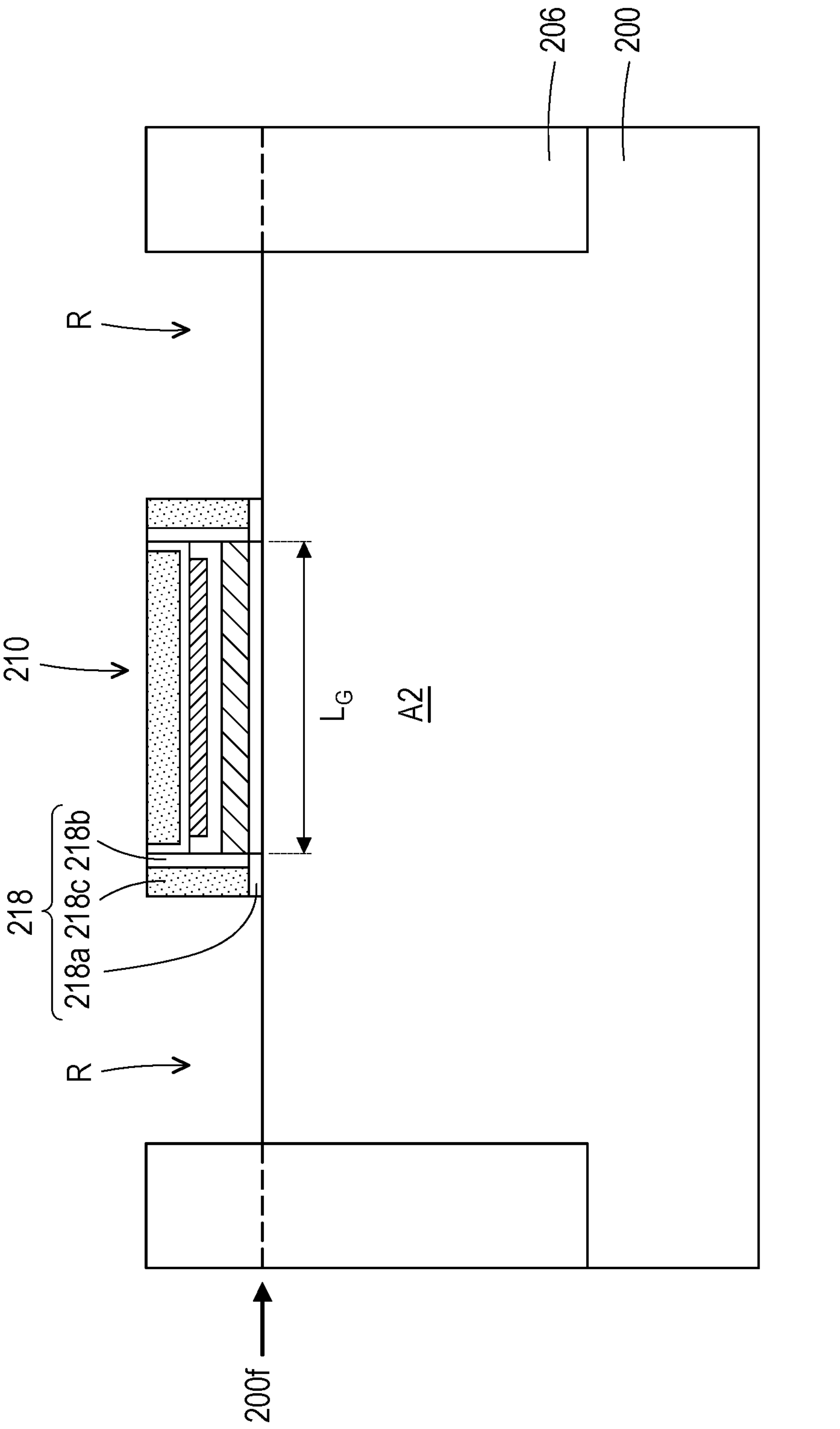

Referring to FIG. 1, FIG. 2I and FIG. 2J, at a step S108, gate spacers 218 are formed on sidewalls of the gate structures 210 shared with the source/drain recesses R. The gate spacers 218 can provide proper electrical isolation between the gate structures 210 and the subsequently formed source/drain structures. According to some embodiments, each gate spacer 218 includes a bottom layer 218*a*, a first sidewall spacer 218*b* and a second sidewall spacer 218*c*. The first sidewall spacers 218*b* extend along the sidewalls of the gate structures 210, and the second sidewall spacers 218*c* are in lateral contact with the gate structures 210 through the first sidewall spacers 218*c*. In addition, the bottom layers 218*a* lies along bottom surfaces of the first and second sidewall spacers 218*b*, 218*c*. A method for forming the gate spacers 218 may include growing first oxide layers on the exposed surfaces of the active regions A1, A2 by a thermal oxidation process. Subsequently, a nitride layer and a second oxide layer are conformally deposited in order, and a self-aligning etching process may be used for shaping the first oxide layer, the nitride layer and the second oxide layer. As a result, remained portions of the first oxide layer form the bottom layers 218*a* of the gate spacers 218; remained portions of the nitride layer form the first sidewall spacers 218*b* of the gate spacers 218; and remained portions of the second oxide layer form the second sidewall spacers 218*c*.

Figure 2K:
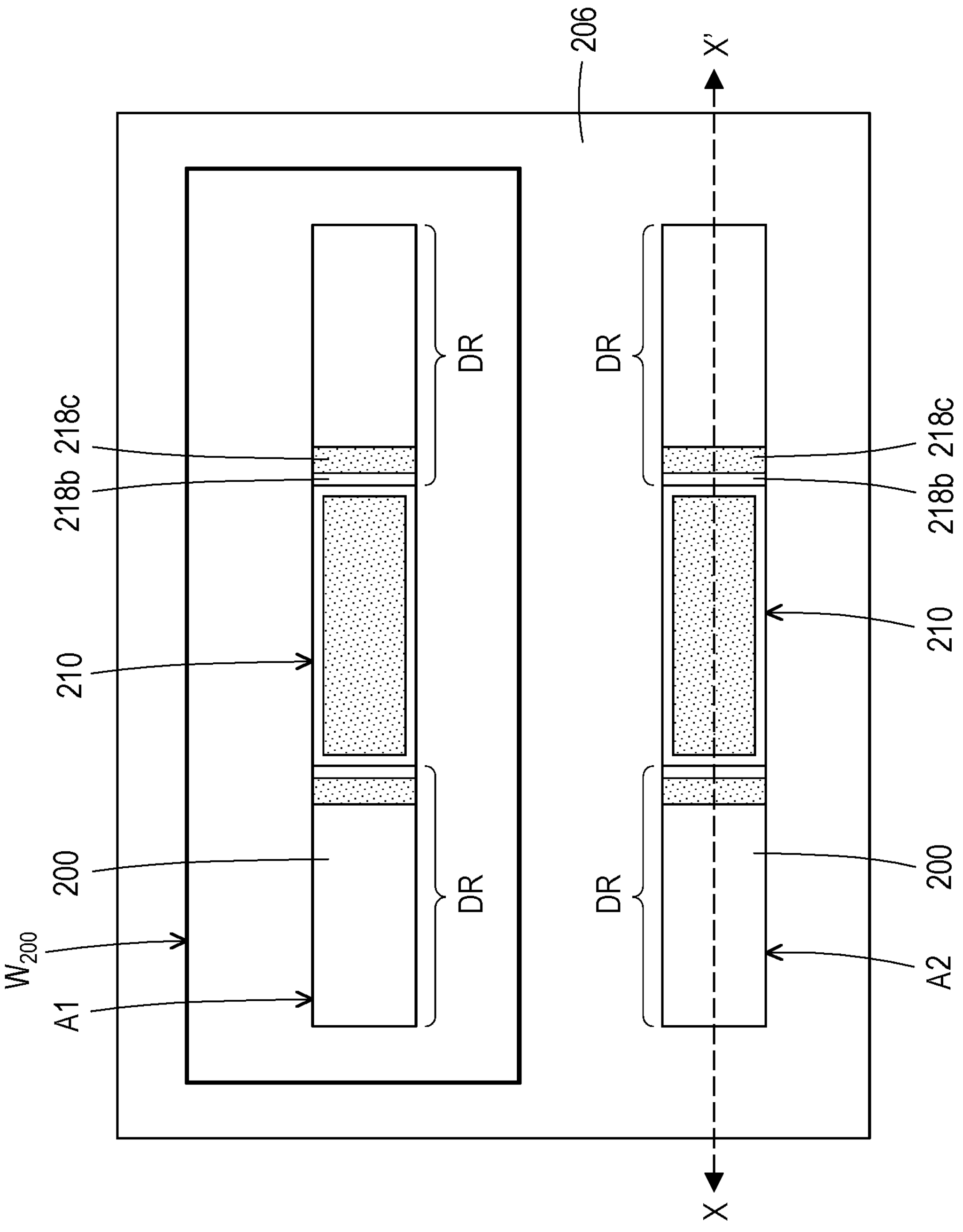
Figure 2L:
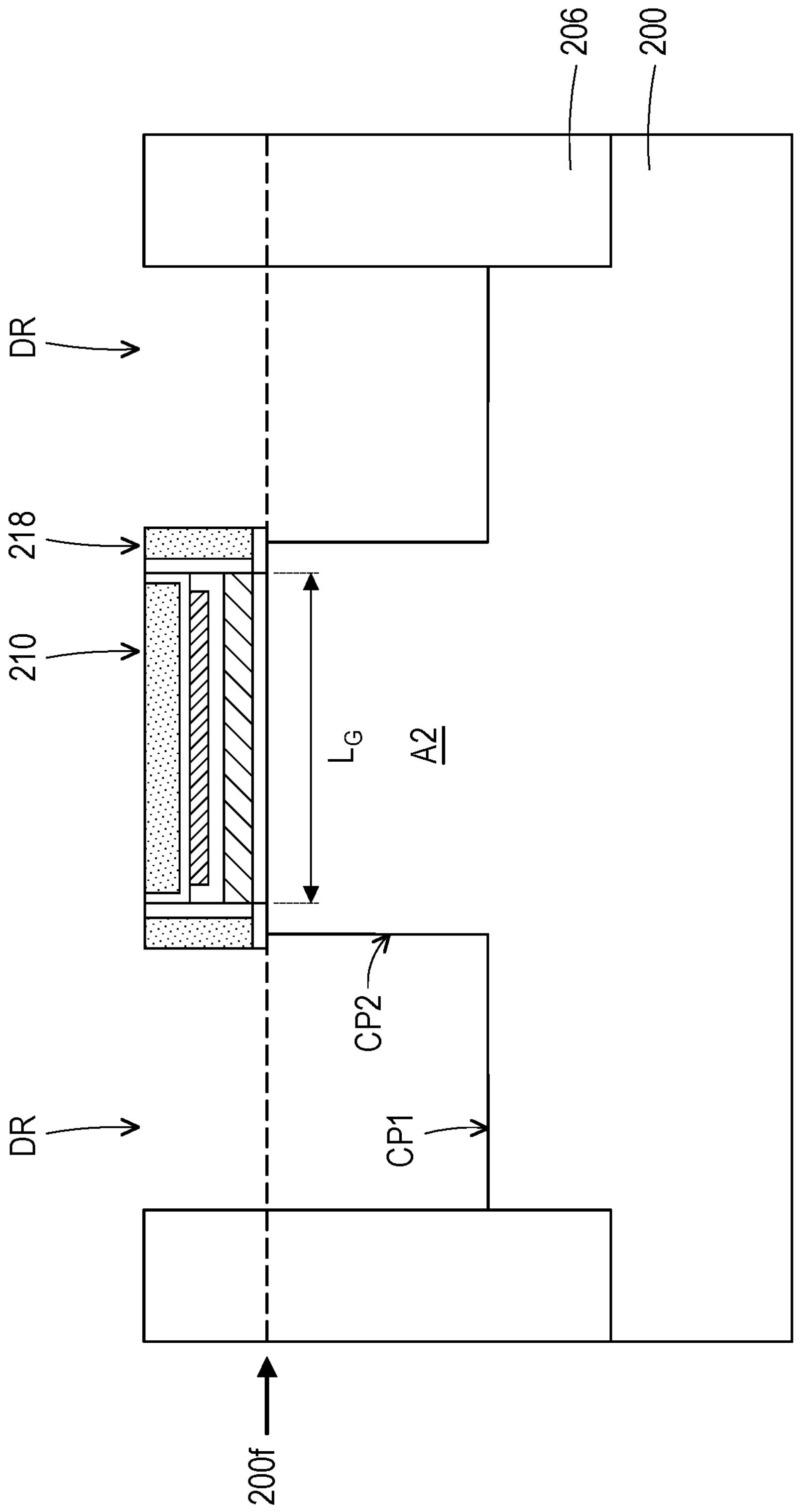

Referring to FIG. 1, FIG. 2K and FIG. 2L, at a step S110, the source/drain recesses R are deepened further into the active regions A1, A2, to form deep source/drain recesses DR. As shown in FIG. 2L, in one example, in addition to extending further deeper, the source/drain recesses R may laterally span, such that the resulted deep source/drain recesses DR may be partially overlapped with the gate spacers 218. Alternatively, the source/drain recesses R may not further expand along a lateral direction, and sidewalls of the resulted deep source/drain recesses DR may be substantially aligned with outermost surfaces of the gate spacers 218.

At least one etching process may be involved for forming the deep source/drain recesses DR. During etching, the gate structures 210, the gate spacers 218 and the trench isolation structure 206 may be collectively functioned as a shadow mask. Therefore, forming an additional mask layer is not necessary, and the etching process may be considered as a self-align etching process. Upon etching, a laterally spanning crystalline plane CP1 and a vertically spanning crystalline plane CP2 of the active region A1/A2 are exposed in each deep source/drain recess DR. In an example that the semiconductor substrate 200 is a silicon substrate, the crystalline plane CP1 may be a (100) crystalline plane, whereas the crystalline plane CP2 may be a (110) crystalline plane.

Figure 2M:
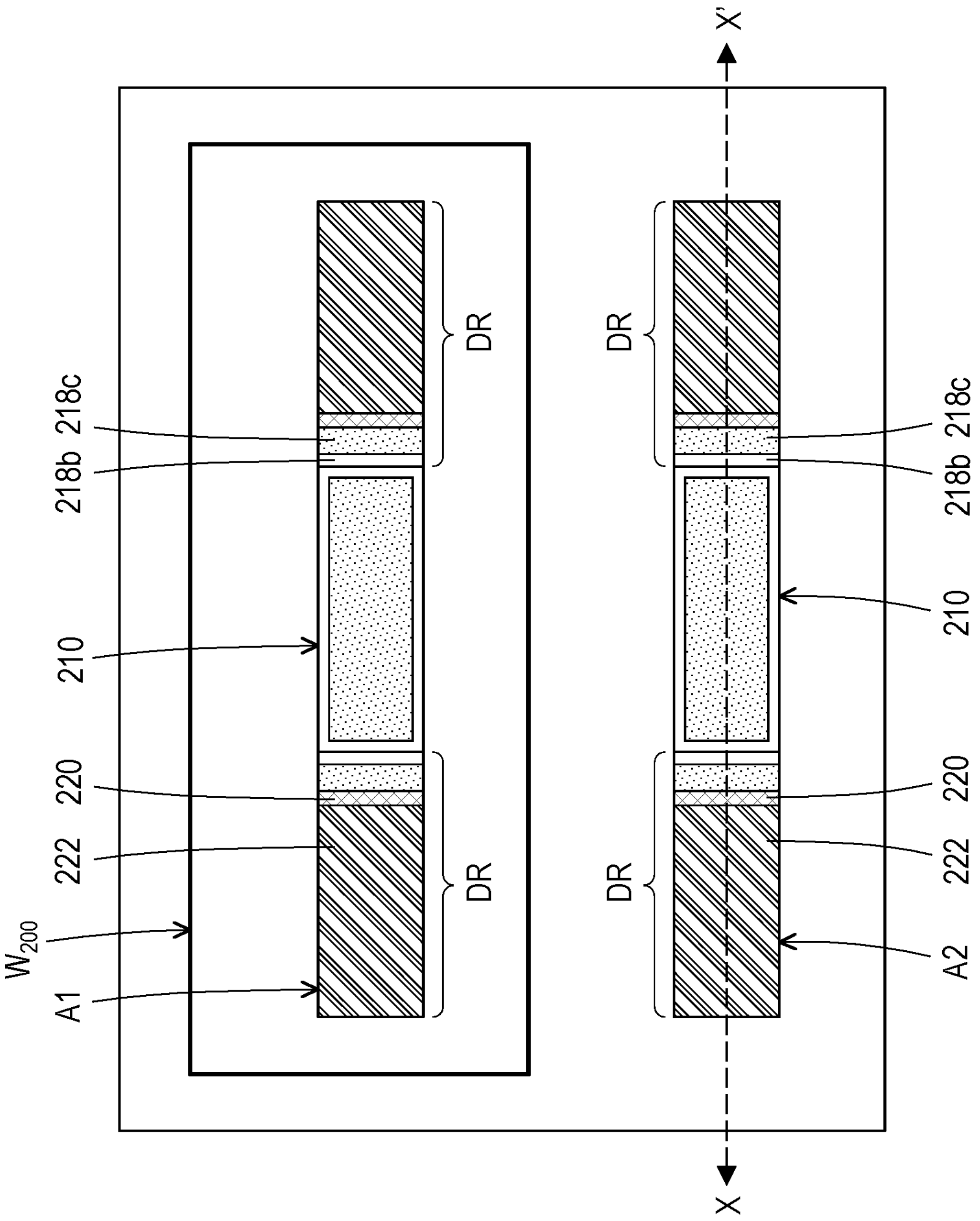
Figure 2N:
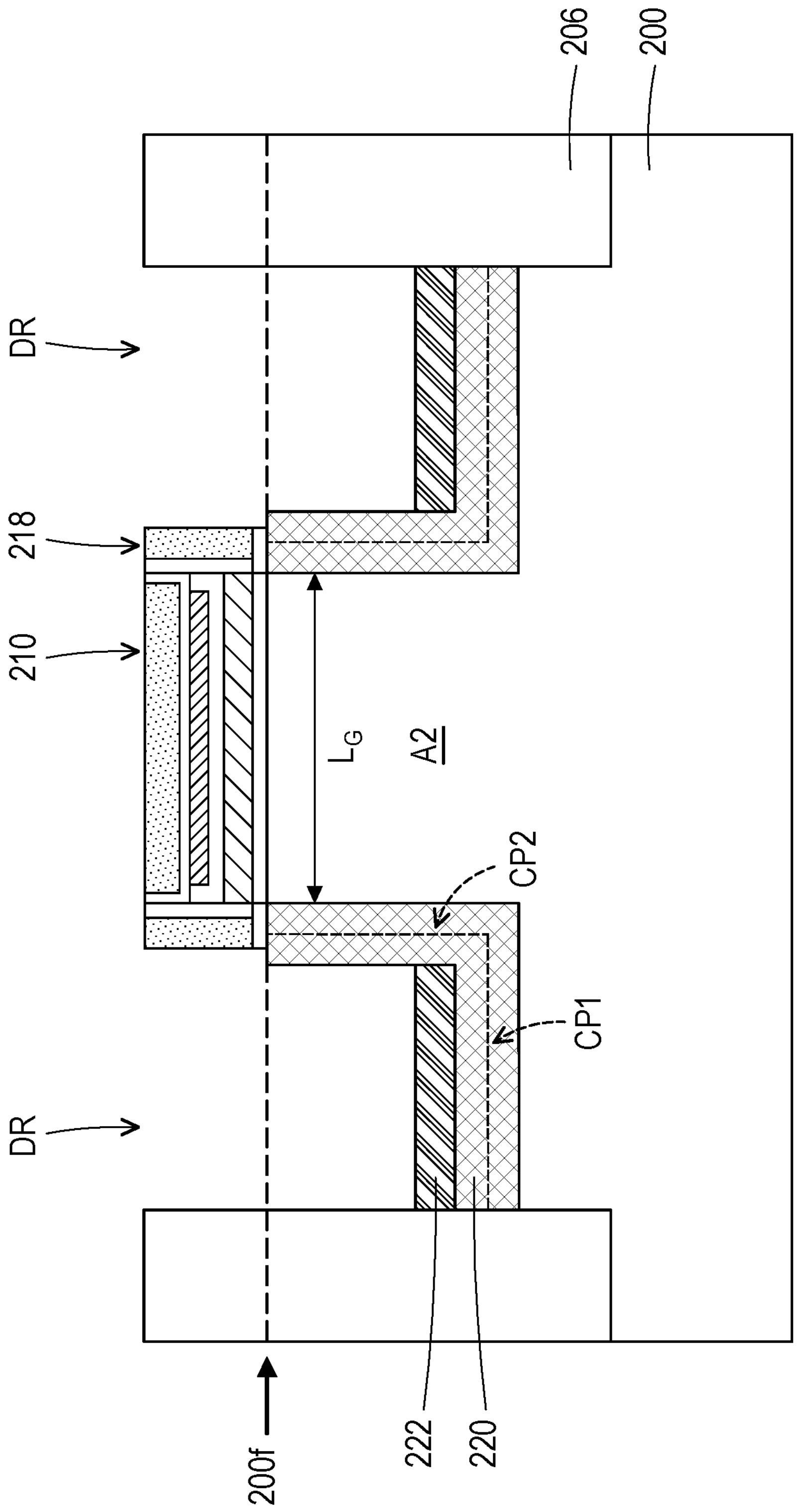
Figure 20:
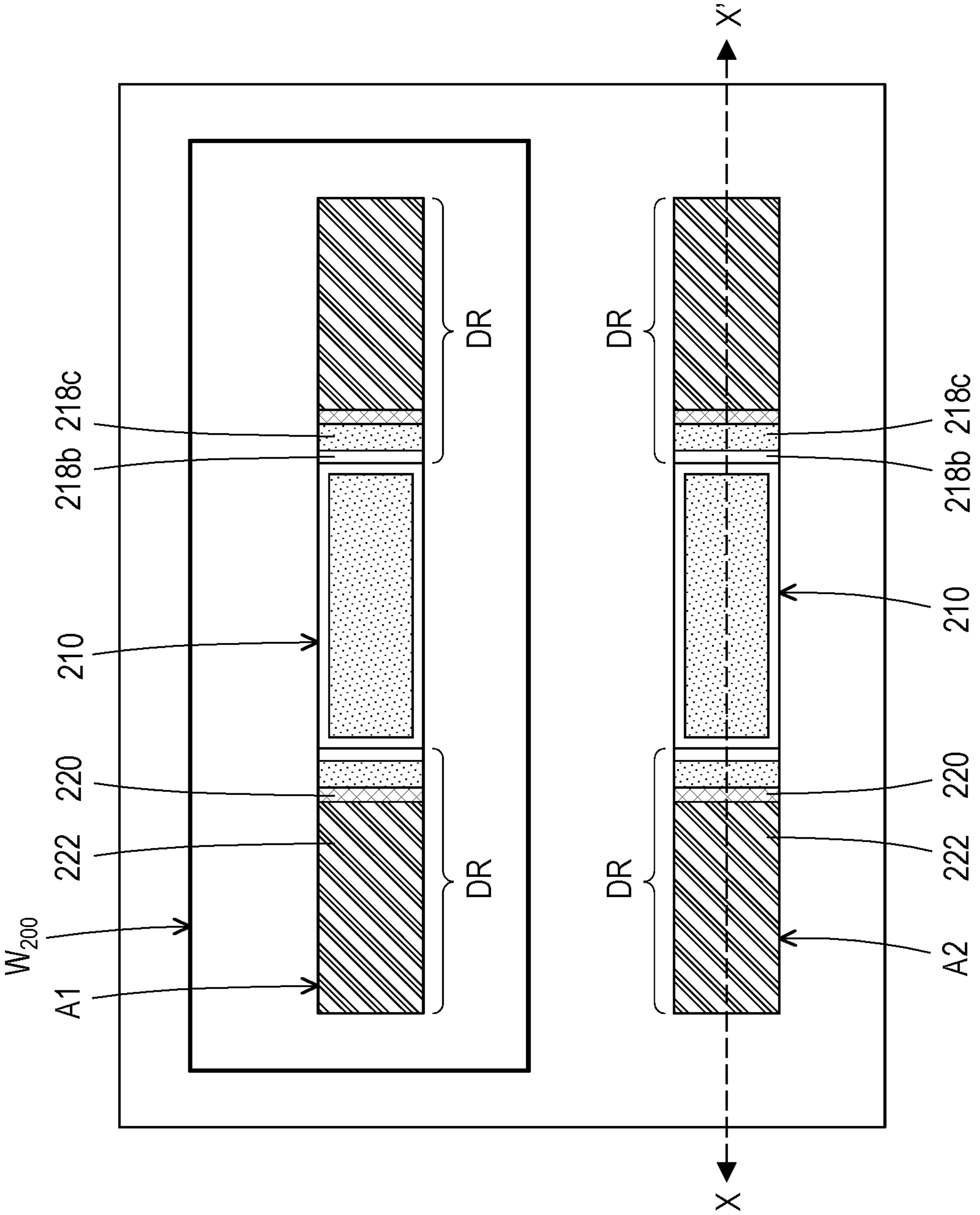

Referring to FIG. 1, FIG. 2M and FIG. 2N, at a step S112, a localized isolation layer 220 and a localized isolation layer 222 are formed in each of the deep recesses DR. The localized isolation layer 220 is formed along the laterally spanning crystalline plane CP1 and the vertically spanning crystalline plane CP2 in each deep recess DR. According to some embodiments, the localized isolation layer 220 is formed of silicon oxide, and a method for forming the localized isolation layer 220 may involve a thermal oxidation process. During the thermal oxidation, the exposed crystalline planes CP1, CP2 are oxidized. As a result, the localized isolation layer 220 is grown from the crystalline planes CP1, CP2, and is formed into the active region A1/A2 from the crystalline planes CP1, CP2. By controlling process temperature, process time and other parameters, the thermal oxidation process can be well controlled that the resulted localized isolation layer 220 laterally spans to a boundary substantially aligned with a sidewall of the overlying gate structure 210. In this way, a length of the active region A1/A2 can be accurately reduced to a channel length substantially identical with the gate length $L_G$, rather than being reduced to a shorter channel length less than the gate length $L_G$. According to some embodiments, the localized isolation layer 220 is formed into the active region A1/A2 from the crystalline planes CP1, CP2 by about 40% of its total thickness, and is grown from the crystalline planes CP1, CP2 by about 60% of its total thickness.

On the other hand, the localized isolation layers 222 respectively cover a bottom portion of one of the localized isolation layers 220. To be more specific, in each deep recess DR, the localized isolation layer 222 lies on a portion of the localized isolation layer 220 formed along the crystalline plane CP1, and is formed to a height lower than a topmost end of the localized isolation layer 220. That is, in each deep recess DR, the portion of the localized isolation layer 220 formed along the crystalline plane CP2 is not entirely covered by the localized isolation layer 222. To be used as an etching mask in a following step, the localized isolation layers 222 have sufficient etching selectivity with respect to the localized isolation layers 220. In those embodiments where the localized isolation layers 220 are formed of silicon oxide, the localized isolation layers 222 may be formed of silicon nitride. Further, a method for forming the localized isolation layers 222 may include a deposition process (e.g., a CVD process) for filling the deep recesses DR with a selected insulating material, and performing an etch back process to recess the insulating material. As a result, portions of such insulating material remained in bottom regions of the deep recesses DR form the localized isolation layers 222.

Figure 2P:
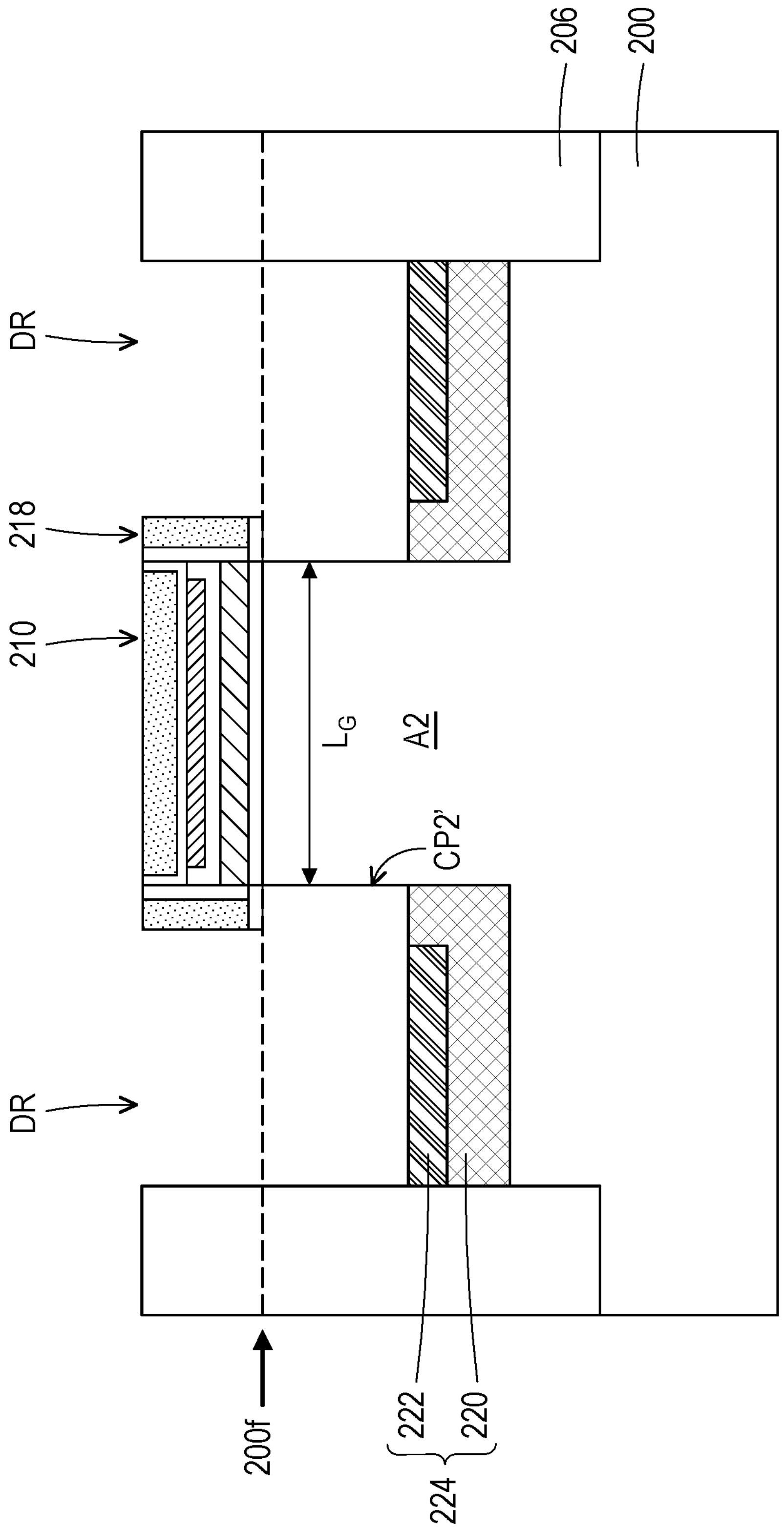

Referring to FIG. 1, FIG. 2O and FIG. 2P, at a step S114, exposed portions of the localized isolation layers 220 are removed. That is, the portions of the localized isolation layers 220 formed along the crystalline planes CP2 and protruding from the localized isolation layer 222 are removed. As a result of the removal, sidewalls of the active regions A1, A2 accurately aligned with the sidewalls of the gate structures 210 are exposed. The exposed sidewalls of the active regions A1, A2 are formed by vertically spanning crystalline planes CP2', which are identical with the vertically spanning crystalline planes CP2, but are more laterally recessed with respect to the gate spacers 218. An etching process may be used for such removal, and the localized isolation layers 222 may be functioned as a shadow mask during the etching.

The localized isolation layer 222 and remained portions of the localized isolation layer 220 in each deep recess DR may be collectively referred to as a buried isolation structure 224. As compared to a buried oxide layer in a semiconductor-on-insulator (SOI) substrate, the buried isolation structures 224 are localized isolation features, and have improved heat dissipation efficiency. In an example that the semiconductor substrate 200 is a silicon substrate, each buried isolation structure 224 may be referred to as a localized isolation into silicon substrate (LISS).

Figure 2Q:
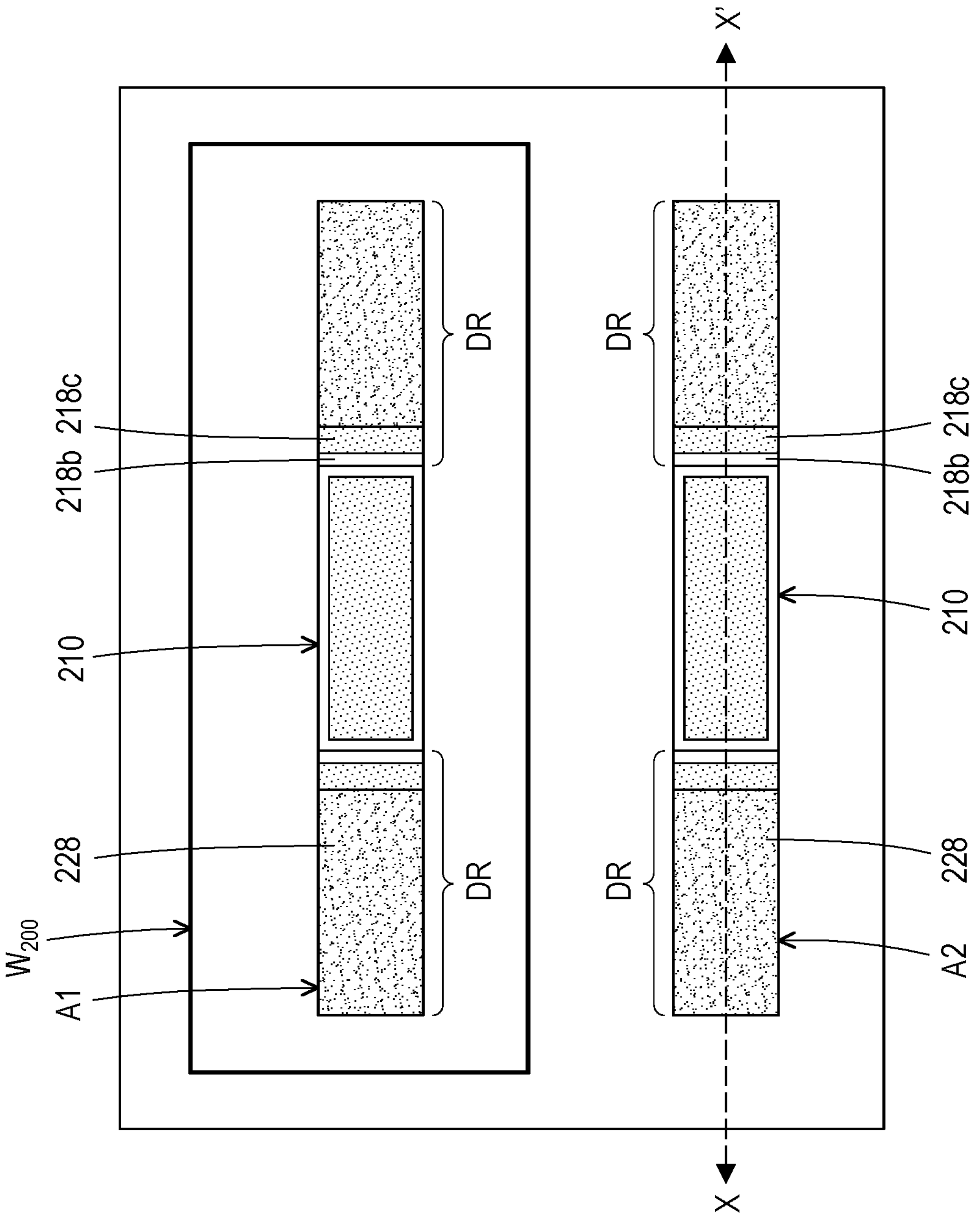
Figure 2R:
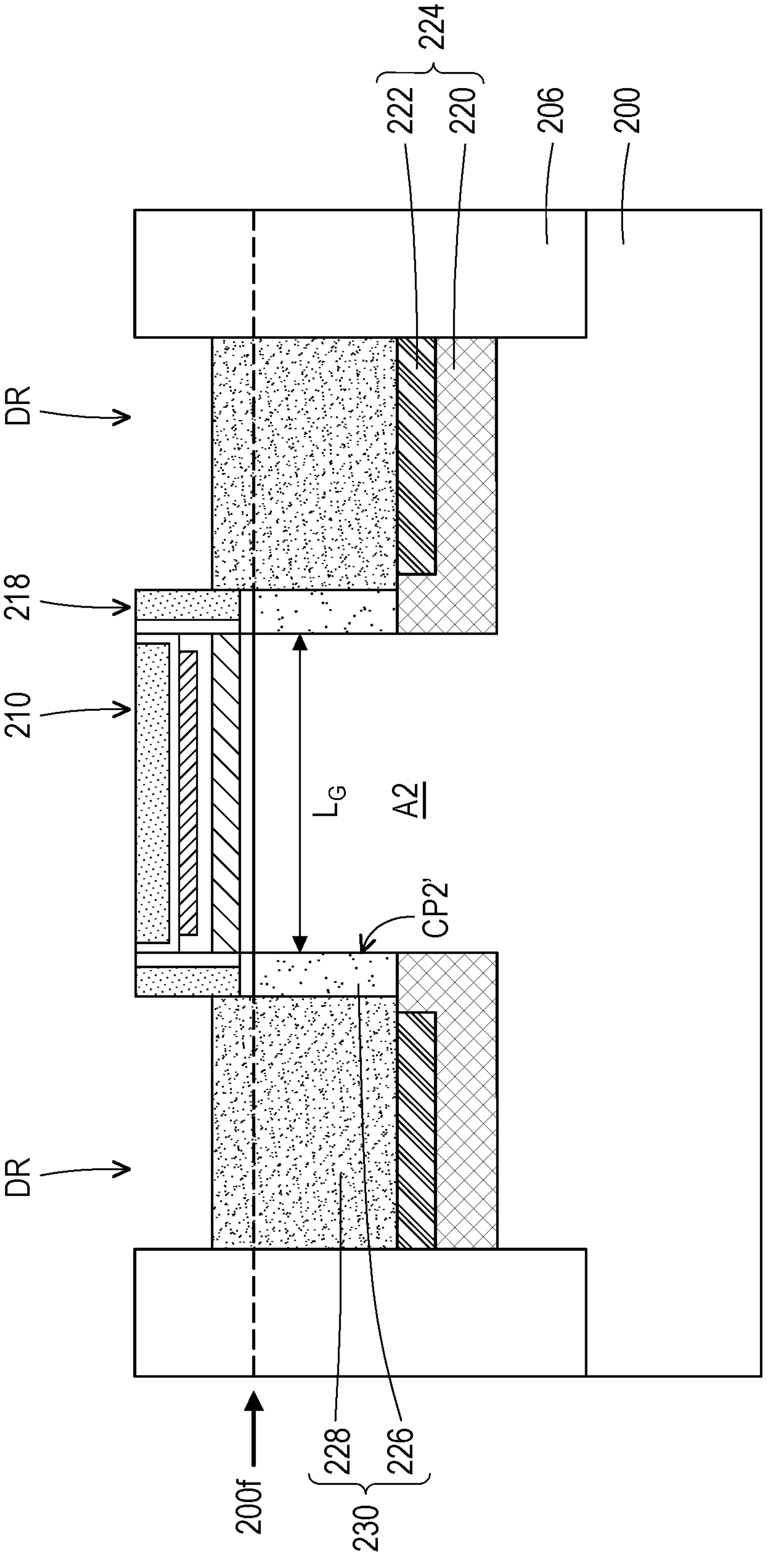

Referring to FIG. 1, FIG. 2Q and FIG. 2R, at a step S116, semiconductor regions 226, 228 with the same conductive type but having different doping concentrations are filled in each of the deep recesses DR. In one embodiment, the semiconductor regions 226 are formed along the exposed crystalline planes CP2', and the semiconductor regions 228 are grown from the semiconductor regions 226, to entirely cover the buried isolation structures 224 and to be in lateral contact with the gate spacers 218. The semiconductor regions 226 may respectively include a lightly doped layer or a combination of an intrinsic layer and a lightly doped layer, whereas the semiconductor regions 228 are heavily doped semiconductor regions. The semiconductor regions 226, 228 in each deep recess DR may be collectively referred to as a source/drain structure 230. The source/drain structures 230 formed on the active region A1 may have P-type dopants. On the other hand, the source/drain structures 230 formed on the active region A2 may have N-type dopants.

As the crystalline planes CP2' are accurately aligned with the sidewalls of the gate structures 210, the source/drain structures 230 formed from the crystalline planes CP2' can be prevented from being overlapped with the gate structures 210. Therefore, gate-induced drain leakage (GIDL) can be effectively reduced. Further, as a bottom side of each source/drain structure 230 is isolated from the semiconductor substrate 200 by one of the buried isolation structures 224, a parasitic junction defined along the bottom side of each source/drain structure 230 is absent. The source/drain structures 230 can only in contact with the semiconductor substrate 200 through the semiconductor regions 226 with relatively low doping concentration. As a result, latch-up paths from the source/drain structures 230 in one of the active regions A1/A2 to the source/drain structures 230 in the other active region A1/A2 are significantly increased without increasing lateral spacing between the active regions A1, A2, and carrier emission at the interface between each source/drain structure 230 and the semiconductor substrate 200 is limited. Therefore, latch-up leakages between the active regions A1, A2 can be effectively reduced without reserving large isolation width between the active regions A1, A2.

According to some embodiments, the semiconductor regions 226, 228 of the source/drain structures 230 are formed by a continuous epitaxial growth process. By changing dopant concentration at different phases of the epitaxial growth process, the semiconductor regions 226, 228 with different doping concentrations can be consecutively formed. Rather than growing from different crystalline planes, the semiconductor regions 226, 228 in each deep recess DR are grown from a single crystalline plane (i.e., the exposed crystalline plane CP2'). Accordingly, the semiconductor regions 226, 228 can be formed with improved quality, and the semiconductor regions 228 may be formed with a substantially planar top surface. In some embodiments, the semiconductor regions 228 are formed to a height lower than the top surfaces of the trench isolation structure 206, the gate spacers 218 and the gate structures 210. In these embodiments, recesses are respectively defined by one of the source/drain structures 230, the trench isolation structure 206 and the gate spacer 218 in lateral contact with this source/drain structure 230.

Figure 2S:
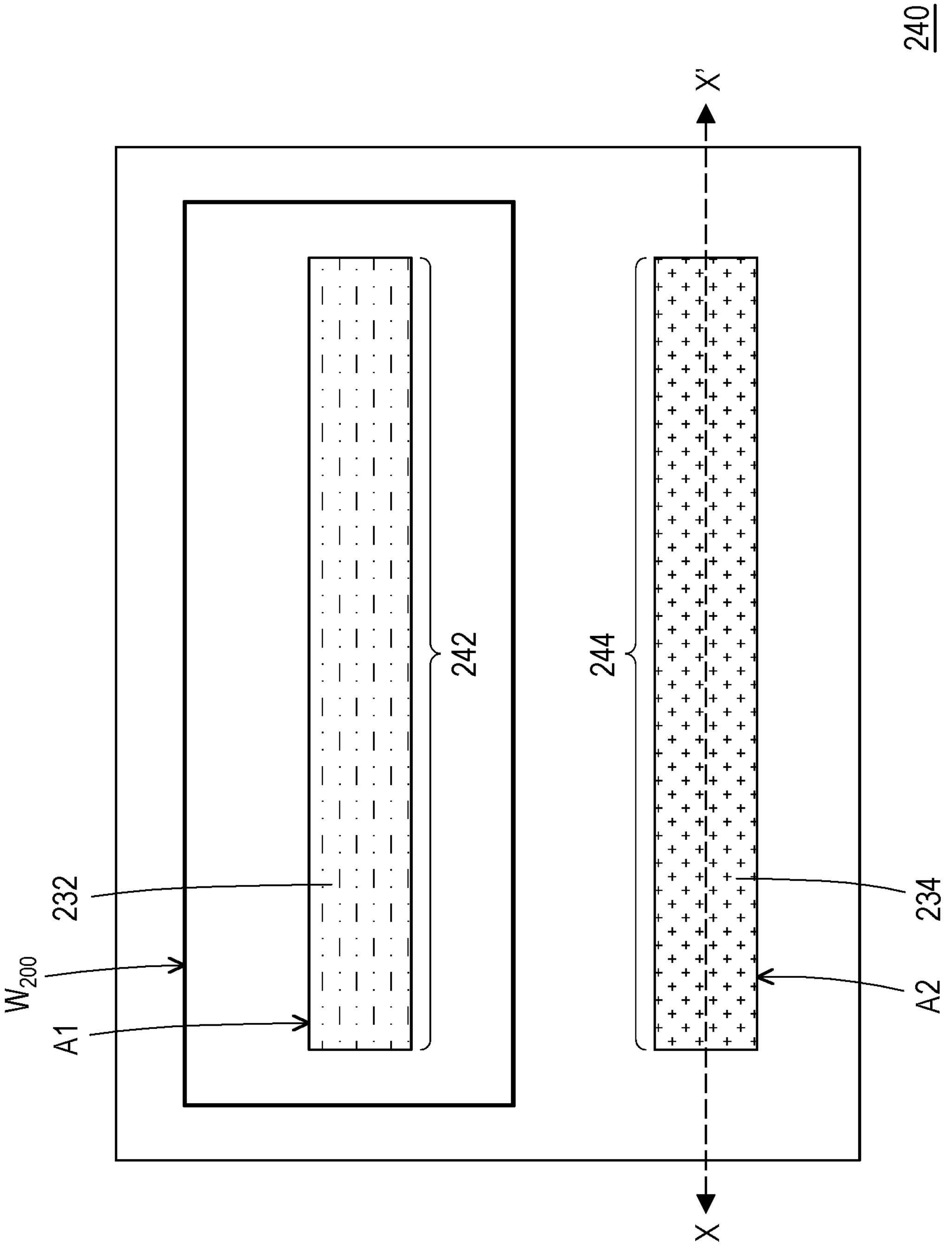
Figure 2T:
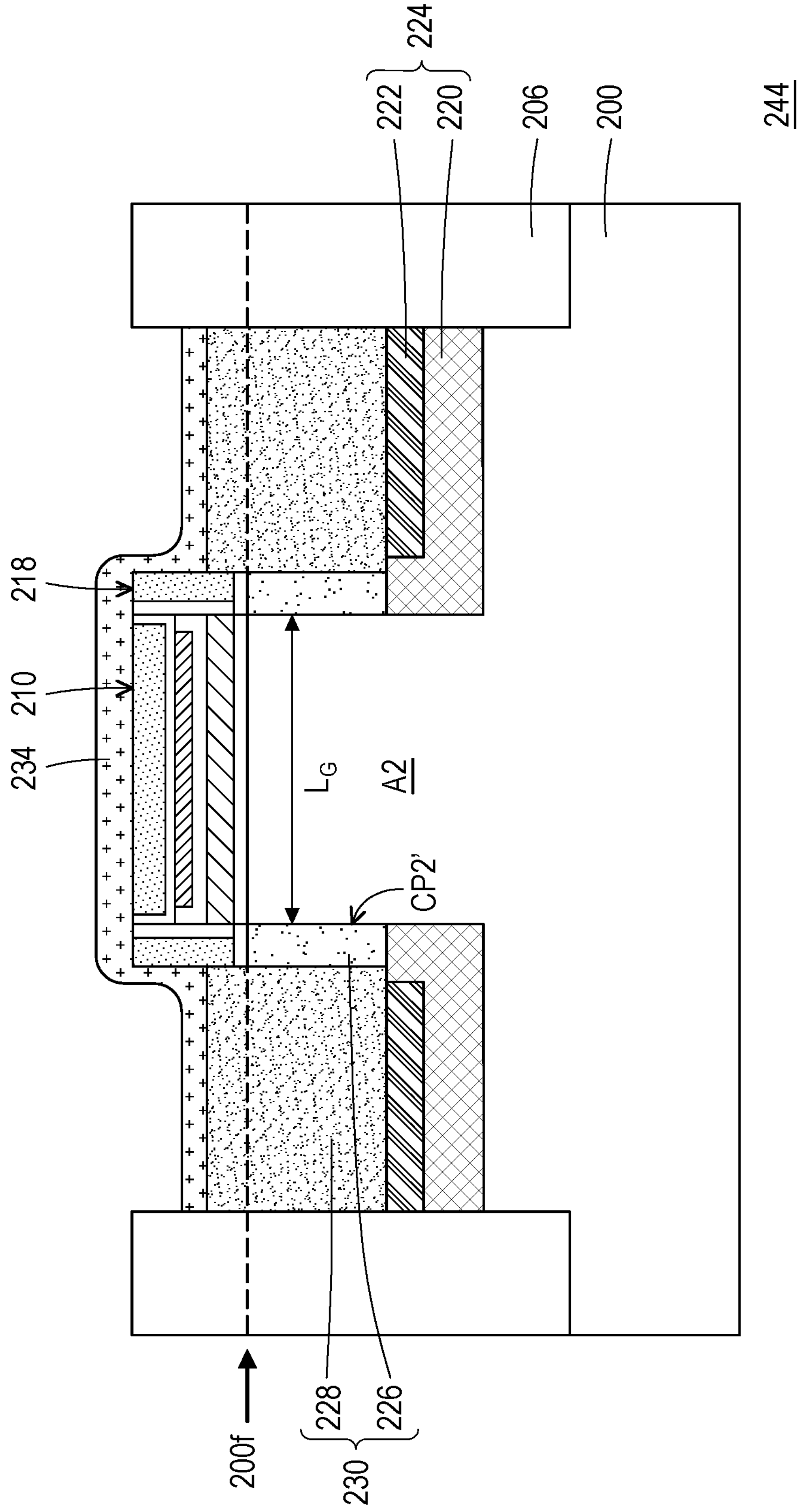

Referring to FIG. 1, FIG. 2S and FIG. 2T, at a step S118, strained etching stop layers 232, 234 are formed over the active regions A1, A2, respectively. During operation, an N-type channel is formed across the active region A2, to establish electrical connection between the source/drain structures 230 at opposite sides of the active region A2. Carriers (i.e., electrons) can pass through the N-type channel with enhanced field effect mobility when the N-type channel is subjected to tensile strain. In order to provide tensile stress to the N-type channel, the strained etching stop layer 234 covering the gate structure 210, the gate spacer 218 and the source/drain structures 230 built on the active region A2 is formed with tensile stressors, and may also be referred to as a tensile etching stop layer.

On the other hand, a P-type channel is formed across the active region A1 during operation, to establish electrical connection between the source/drain structures 230 at opposite sides of the active region A1. Carriers (i.e., holes) can pass through the P-type channel with enhanced field effect mobility when the P-type channel is subjected to compressive strain. To provide compressive stress to the P-type channel, the strained etching stop layer 232 covering the gate structure 210, the gate spacer 218 and the source/drain structures 230 built on the active region A1 is formed with compressive stressors, and may also be referred to as a compressive etching stop layer.

According to some embodiments, the strained etching stop layers 232, 234 are both formed of silicon nitride, and a method for forming each of the strained etching stop layers 232, 234 may include a deposition process (e.g., a CVD process). In these embodiments, by using different deposition parameters for forming the strained etching stop layers 232, 234, the resulted strained etching stop layers 232, 234 can have the compressive stressor and the tensile stressor, respectively. For instance, a process temperature for depositing the strained etching stop layer 232 may be different from a process temperature for depositing the strained etching stop layer 234.

Up to here, a transistor structure 240 including a PMOS 242 built on the active region A1 and an NMOS 244 built on the active region A2 has been formed. As described, among many features, each of the PMOS 242 and the NMOS 244 is formed with the source/drain structures 230 grown from the crystalline planes CP2' accurately aligned with edges of the gate structure 210 as well as the buried isolation structures 224 isolating the source/drain structures 230 from the semiconductor substrate 200, and further formed with the strained etching stop layer 232/234 for providing tensile/compressive stress to the channel bridging one of the source/drain structures 230 to the other. As channel length can be accurately defined, reserving excessive spare channel length for minimizing SCE is no longer required. Also, as junctions are no longer formed along bottom sides of the source/drain structures 230, much longer latch-up paths are resulted, and latch-up can be effectively prevented without increasing lateral spacing between the PMOS 242 and the NMOS 244. On top of that, owing to the strain engineering using the strained etching stop layers 232, 234, driving ability of the PMOS 242 and the NMOS 244 can be enhanced.

Instead of limiting to the strain engineering approach describe above, other strain engineering approaches may be used in alternative embodiments.

Figure 3A:
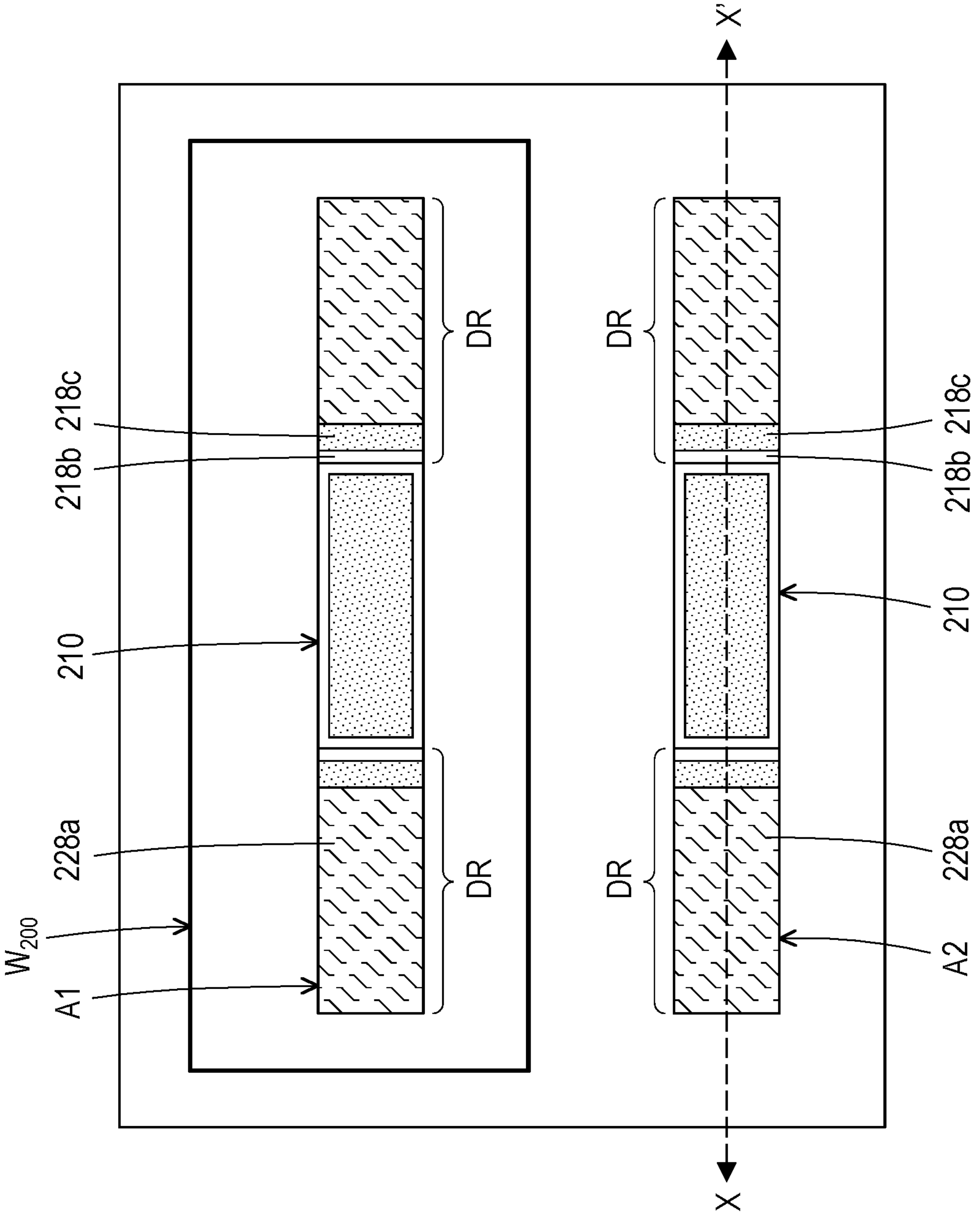
FIG. 3A through FIG. 3H illustrate structures at a serios of stages during a process for forming a transistor structure, according to some embodiments of the present disclosure.
Figure 3B:
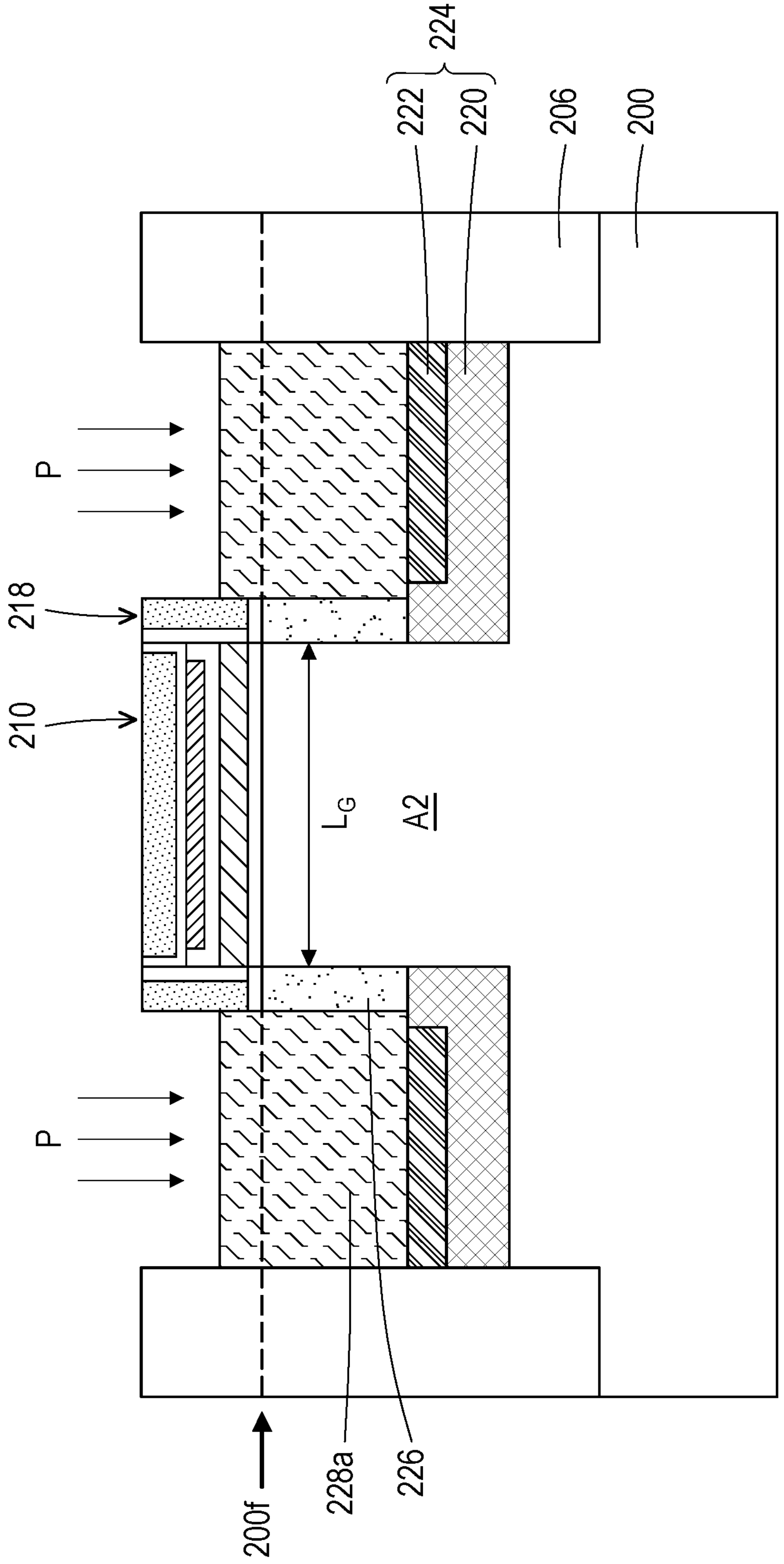

FIG. 3A through FIG. 3H illustrate structures at a serios of stages during a process for forming a transistor structure, according to some embodiments of the present disclosure. Particularly, FIG. 3A, FIG. 3C, FIG. 3E and FIG. 3G show schematic plan views of these structures, and FIG. 3B, FIG. 3D, FIG. 3F and FIG. 3H are respectively a schematic cross-sectional view along an X-X' line shown in the previous schematic plan view (e.g., FIG. 3B is a cross-sectional view along the X-X' line shown in FIG. 3A).

This transistor structure manufacture process is similar to the transistor structure manufacture process described with reference to FIG. 1 and FIG. 2A through FIG. 2T, except that the source/drain structures 230 are further processed to have dislocation stressors.

Specifically, such transistor structure manufacture process may begin with the steps S100, S102, S104, S106, S108, S110, S112, S114, S116 described with reference to FIG. 1 and FIG. 2A through FIG. 2R. Thereafter, as shown in FIG. 3A and FIG. 3B, a pre-amorphous implantation (PAI) process P is performed on the semiconductor regions 228. The PAI process P implants the semiconductor regions 228 and damages lattice structure of the semiconductor regions 228, to form amorphized semiconductor regions 228*a*. The PIA process P can be tuned by (as examples) controlling implant angle, implant energy, implant species and/or implant dosage. In one embodiment, the PAI process P implants the semiconductor regions 228 with germanium (Ge). Alternatively, the PAI process P may use other implant species, such as Ar, Xe, BF2, As, In, any other suitable implant species or combinations thereof.

Figure 3C:
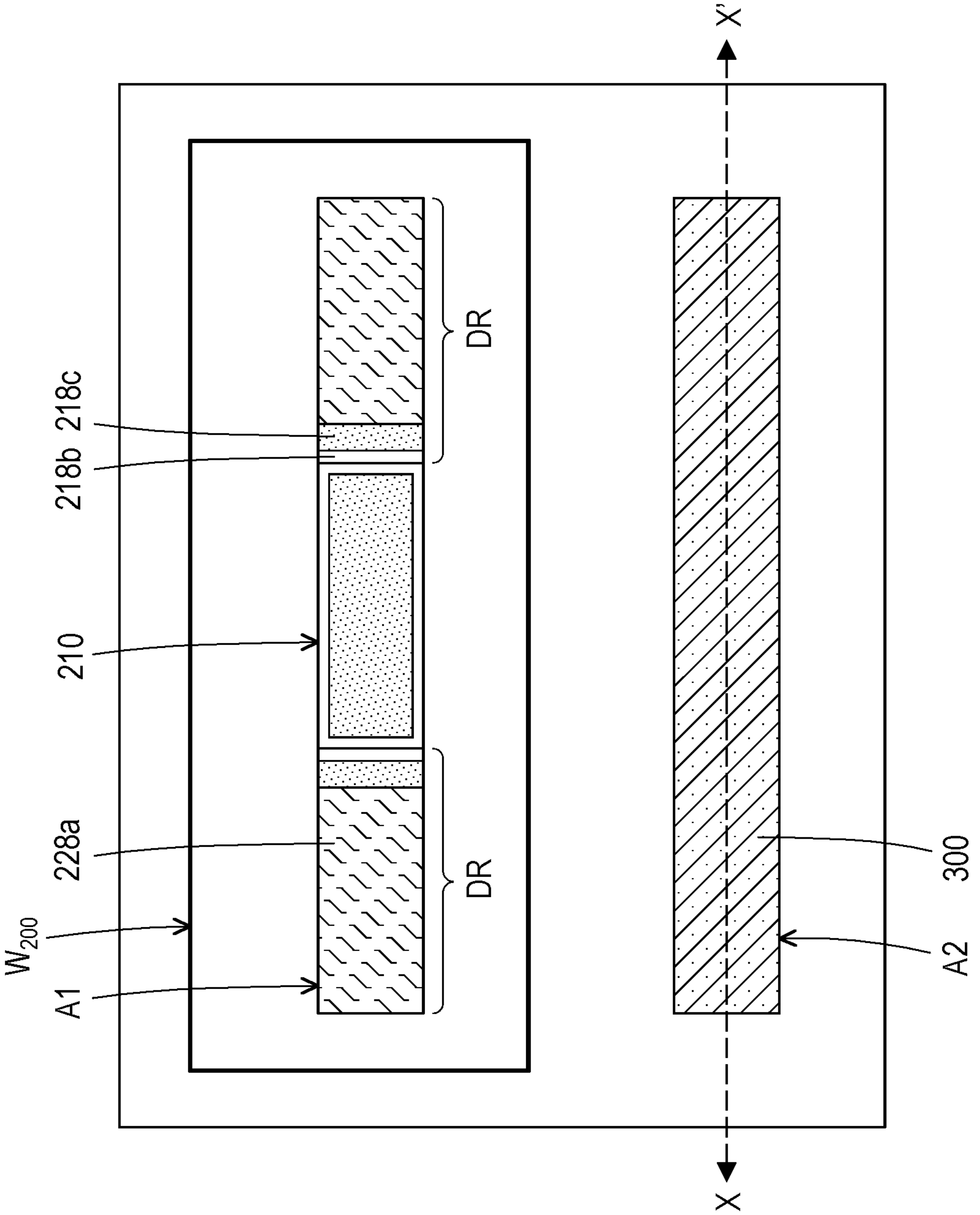
Figure 3D:
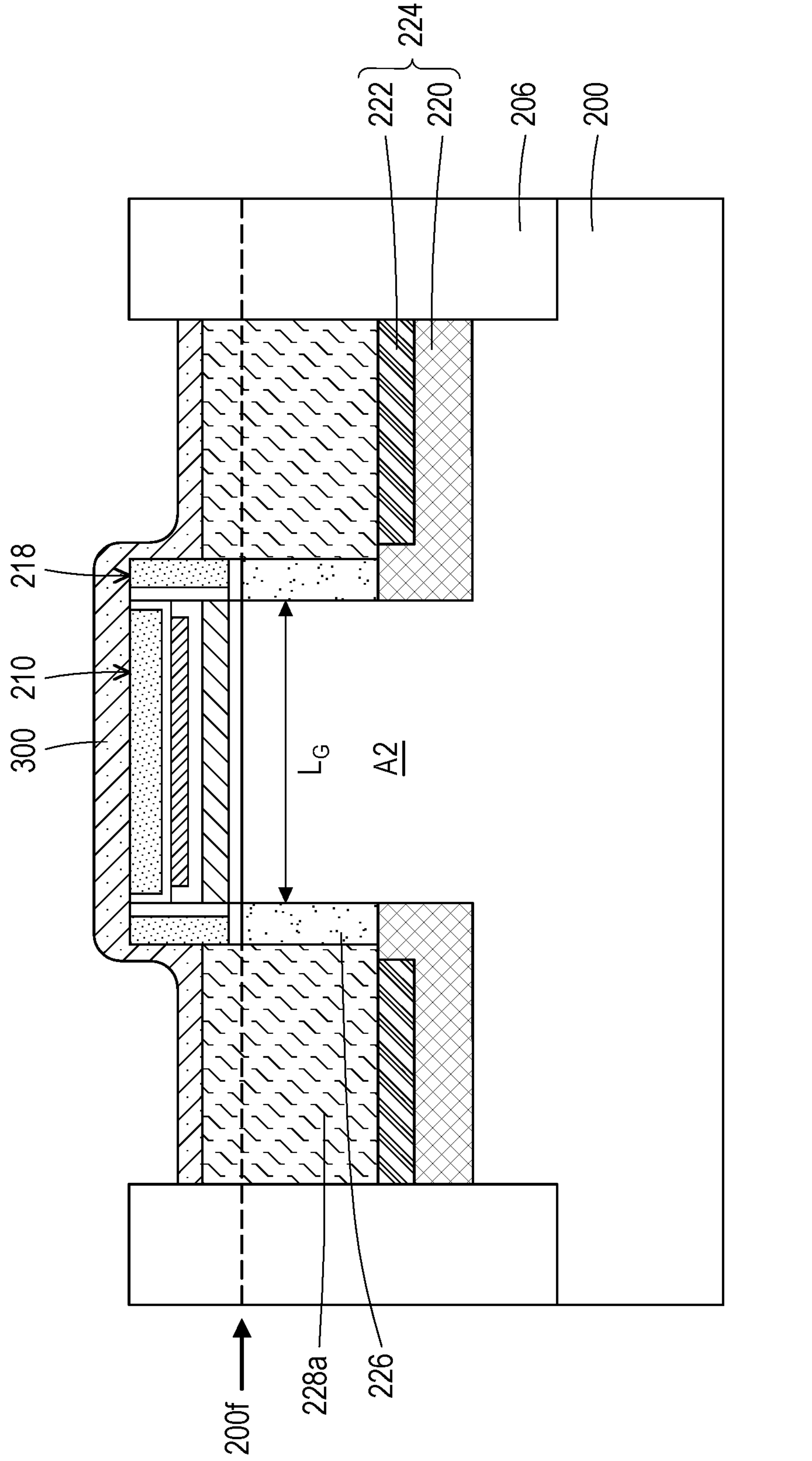

Subsequently, as shown in FIG. 3C and FIG. 3D, a capping layer 300 is formed over the active region A2, where an NMOS will be eventually formed. The capping layer 300 covers the amorphized semiconductor regions 228*a*, the gate spacers 218 and the gate structure 210 formed on the active region A2, and heterogeneous interfaces are defined between the capping layer 300 and the underlying amorphized semiconductor regions 228*a*. On the other hand, the amorphized semiconductor regions 228*a*, the gate spacers 218 and the gate structure 210 formed on the active region A1 (where a PMOS will be eventually formed) may not be covered by the capping layer 300, but may be covered by a mask pattern (not shown). According to some embodiments, the capping layer 300 is formed of silicon nitride. Further, in some embodiments, the capping layer 300 is formed with tensile stressors.

Figure 3E:
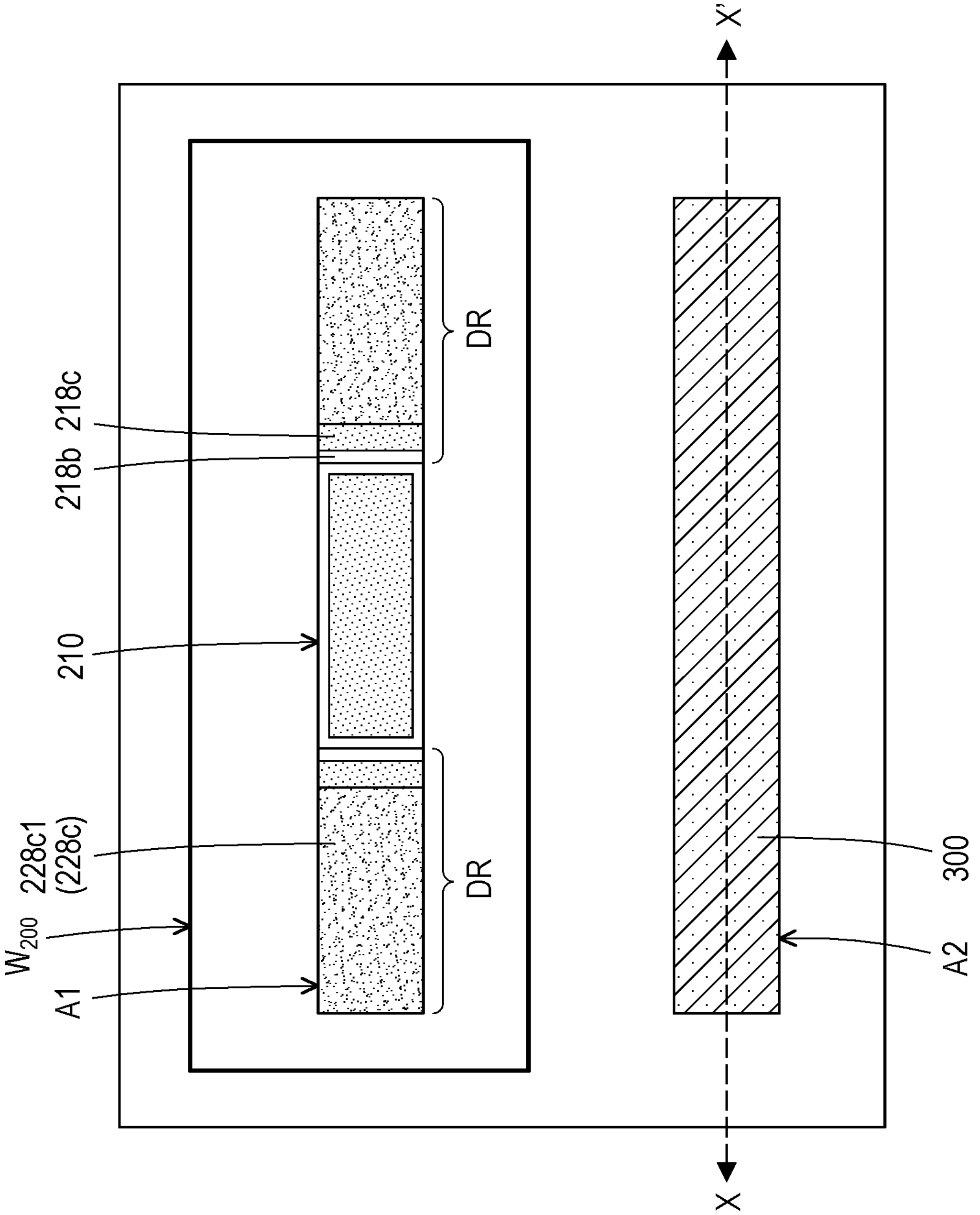
Figure 3F:
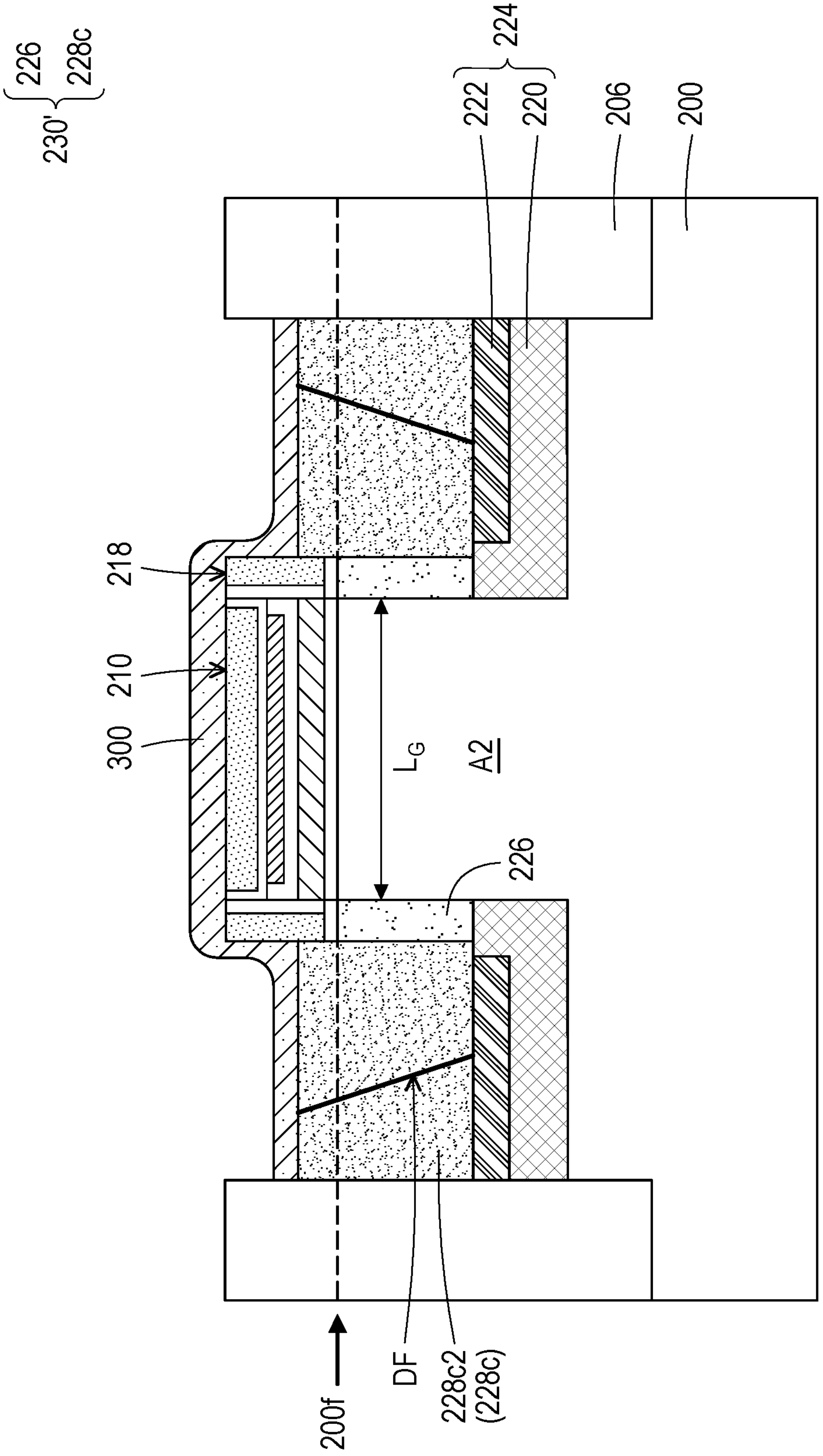

Afterwards, as shown in FIG. 3E and FIG. 3F, an annealing process is performed. As a result, the amorphized semiconductor regions 228*a* are recrystallized to be crystalline semiconductor regions 228*c*, and source/drain structures 230' each including one of the crystalline semiconductor regions 228*c* and the adjacent one of the semiconductor regions 226 are formed. Particularly, as the heterogeneous interfaces are defined between the capping layer 300 and the underlying amorphized semiconductor regions 228*a*, dislocations DF resulted from missing atoms may be formed from these heterogeneous interfaces during the recrystallization. Consequently, these dislocations DF may extend in the resulted crystalline semiconductor regions 228*c* (also referred to as crystalline semiconductor regions 228*c*2). The dislocations DF in the crystalline semiconductor regions 228*c*2 may result in longitudinal tensile stress and vertical compressive stress in the N-type channel bridging the crystalline semiconductor regions 228*c*2 to the other. Therefore, carrier mobility in the N-type channel can be boosted, and driving ability of the resulted NMOS can be enhanced. In those embodiments where the capping layer 300 is formed with tensile stressors, the tensile stressors may also contribute to formation of the dislocations DF.

On the other hand, the amorphized semiconductor regions 228*a* not covered by the capping layer 300 may be recrystallized without formation of the dislocation stressors (or recrystallized with fewer of the dislocation stressors), and the resulted crystalline semiconductor regions 228*c* may also be referred to as crystalline semiconductor regions 228*c*1.

Figure 3G:
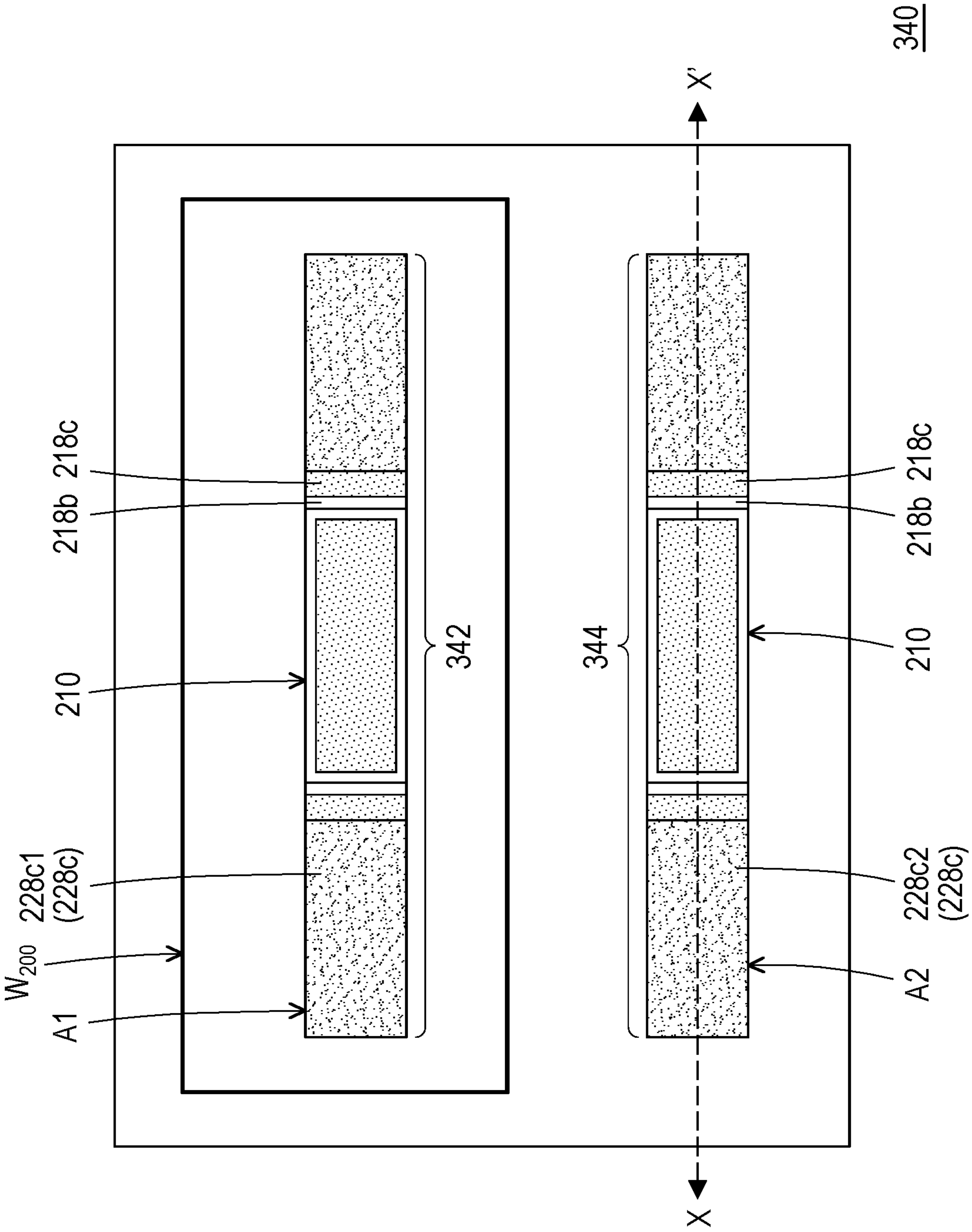
Figure 3H:
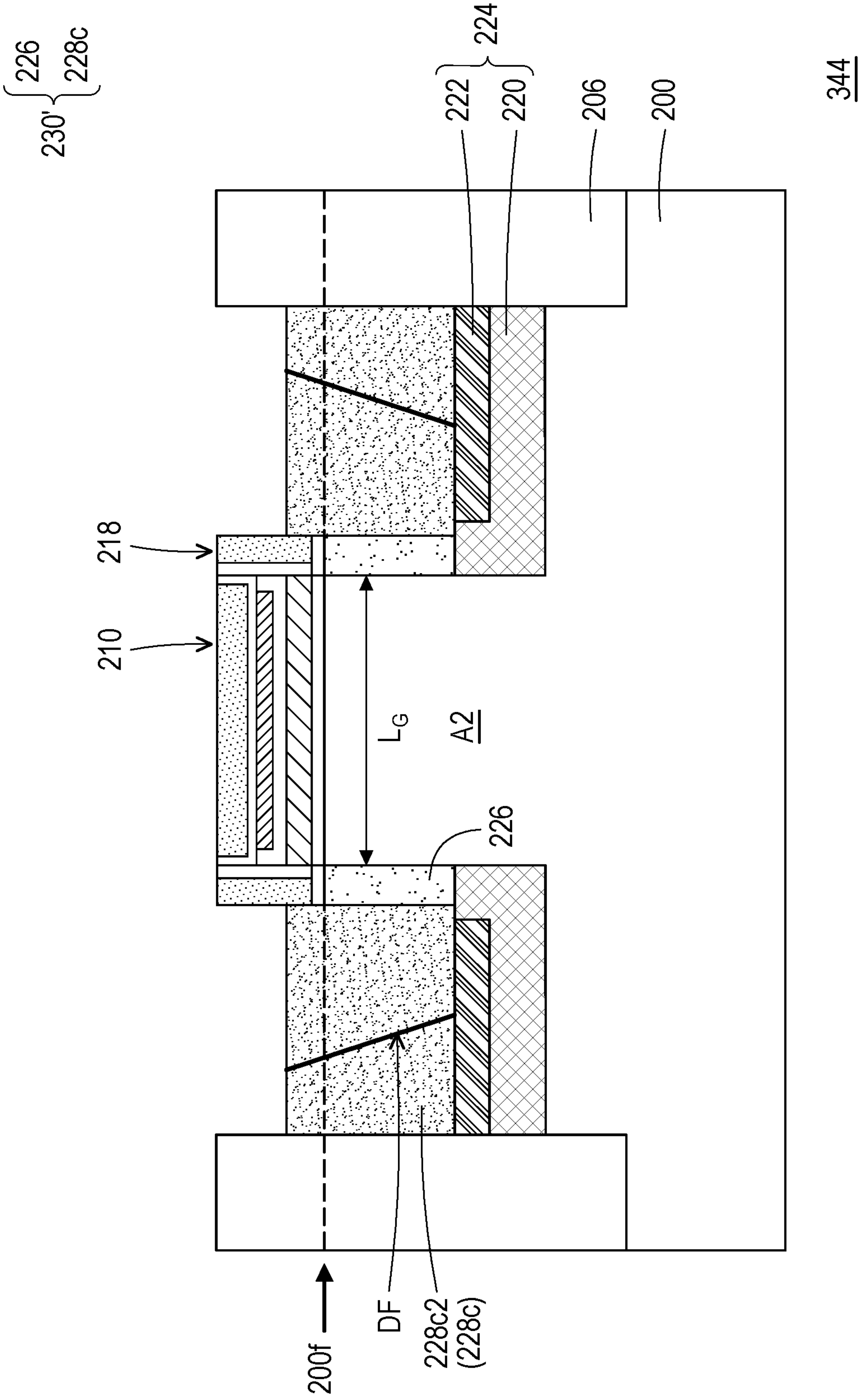

Thereafter, as shown in FIG. 3G and FIG. 3H, the capping layer 300 may be removed. Up to here, a transistor structure 340 including a PMOS 342 built on the active region A1 and an NMOS 344 built on the active region A2 has been formed. As the source/drain structures 230' of the NMOS 344 are formed with the dislocation stressors, the N-type channel of the NMOS 344 can be subjected to tensile stress, thus the NMOS 344 can be operated with improved carrier mobility and enhanced driving ability.

In other embodiments, the capping layer 300 may remain in the NMOS 344. In alternative embodiments, after removal of the capping layer 300, the strained etching stop layers 232, 234 (described with reference to FIG. 2S and FIG. 2T) may be further formed over the active regions A1, A2, respectively. In these alternative embodiments, the PMOS 342 further includes the strained etching stop layer 232 with compressive stressors, and the NMOS 344 further includes the strained etching stop layer 234 with tensile stressors. In this way, carrier mobility of each of the PMOS 342 and the NMOS 344 may be further boosted.

In addition to variation of strain engineering approaches, other variations can be applied to each of the disclosed embodiments, which may include variation to growth planes of the semiconductor regions 226, 228.

Figure 4:
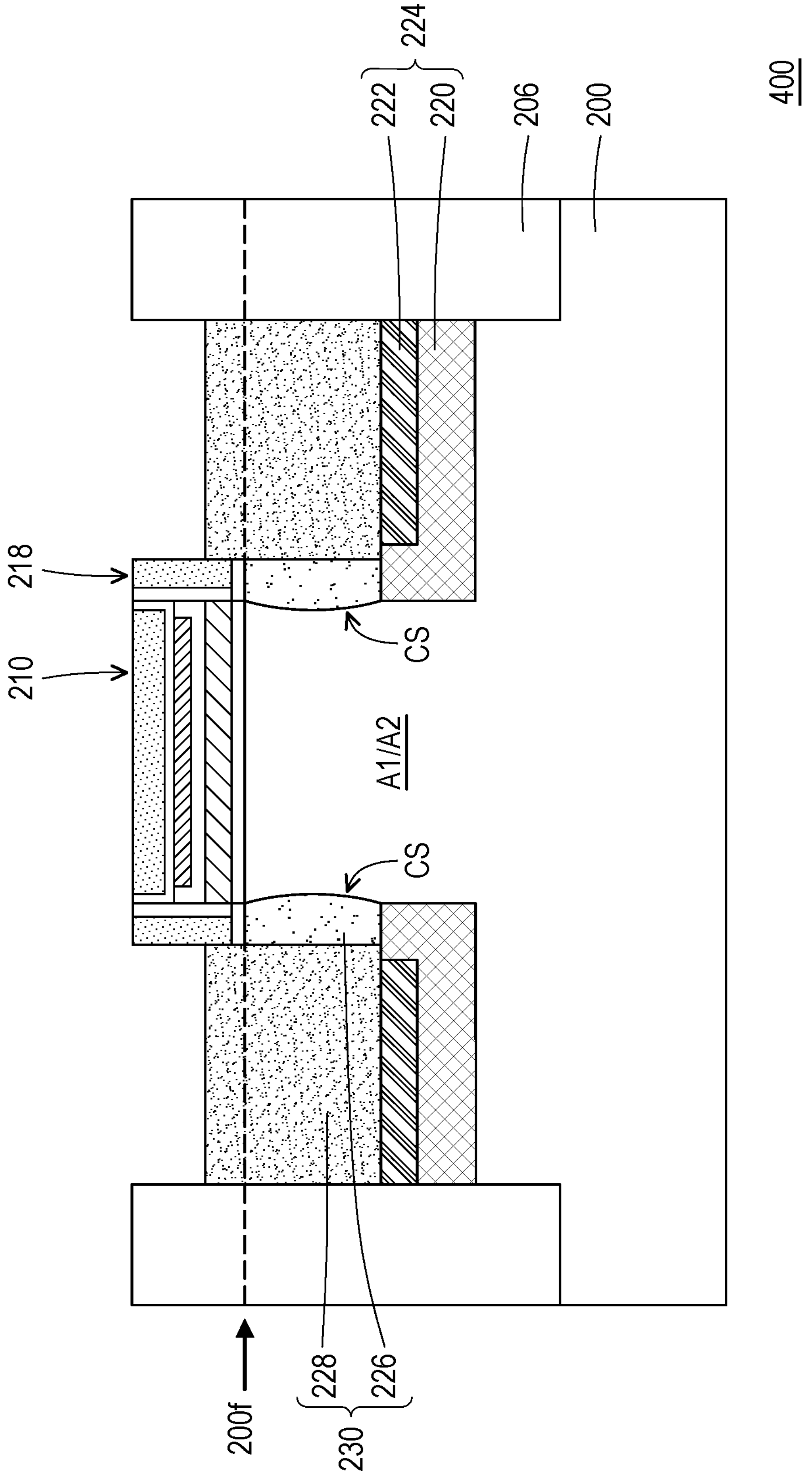
FIG. 4 is a cross-sectional view of a MOSFET (a PMOS or an NMOS) in a transistor structure, according to some embodiments.

FIG. 4 is a cross-sectional view of a MOSFET 400 (a PMOS or an NMOS) in a transistor structure, according to some embodiments.

According to the afore-described embodiments, the semiconductor regions 226, 228 are grown from straight sidewalls of the active regions A1, A2 that are accurately aligned with the sidewalls of the gate structures 210. On the other hand, in the embodiments shown in FIG. 4, the semiconductor regions 226, 228 are grown from curved or depressed sidewalls (such as concave sidewall) CS of the active regions A1, A2. As grown from the curved or depressed sidewalls CS, each of the resulted semiconductor regions 228 can have a more planar top surface. Therefore, a highly planar landing surface can be provided for contact structures (not shown) landing on the semiconductor regions 228, and a contact resistance between the contact structures and the semiconductor regions 228 can be effectively lowered.

During manufacturing, after the step S114 for removing the portions of the localized isolation layers 220 not shielded by the localized isolation layers 222 (described with reference to FIG. 2O and FIG. 2P), the exposed crystalline planes CP2' may be further etched to form the curved or depressed sidewalls CS. Thereafter, the semiconductor regions 226, 228 are grown from the curved or depressed sidewalls CS.

Although not shown, one or both of the described strain engineering approaches can be applied to the MOSFET 400. That is, the MOSFET 400 with a P-type channel may be covered by the strained etching stop layer 232 with compressive stressors. On the other hand, the MOSFET 400 with an N-type channel may be further processed to have dislocation stressors in the resulted source/drain structures 230', and/or covered by the strained etching stop layer 234 with tensile stressors.

Furthermore, a variation to formation order of the gate structures 210 and the gate spacers 218 can be applied to each of the described embodiments.

Figure 5A:
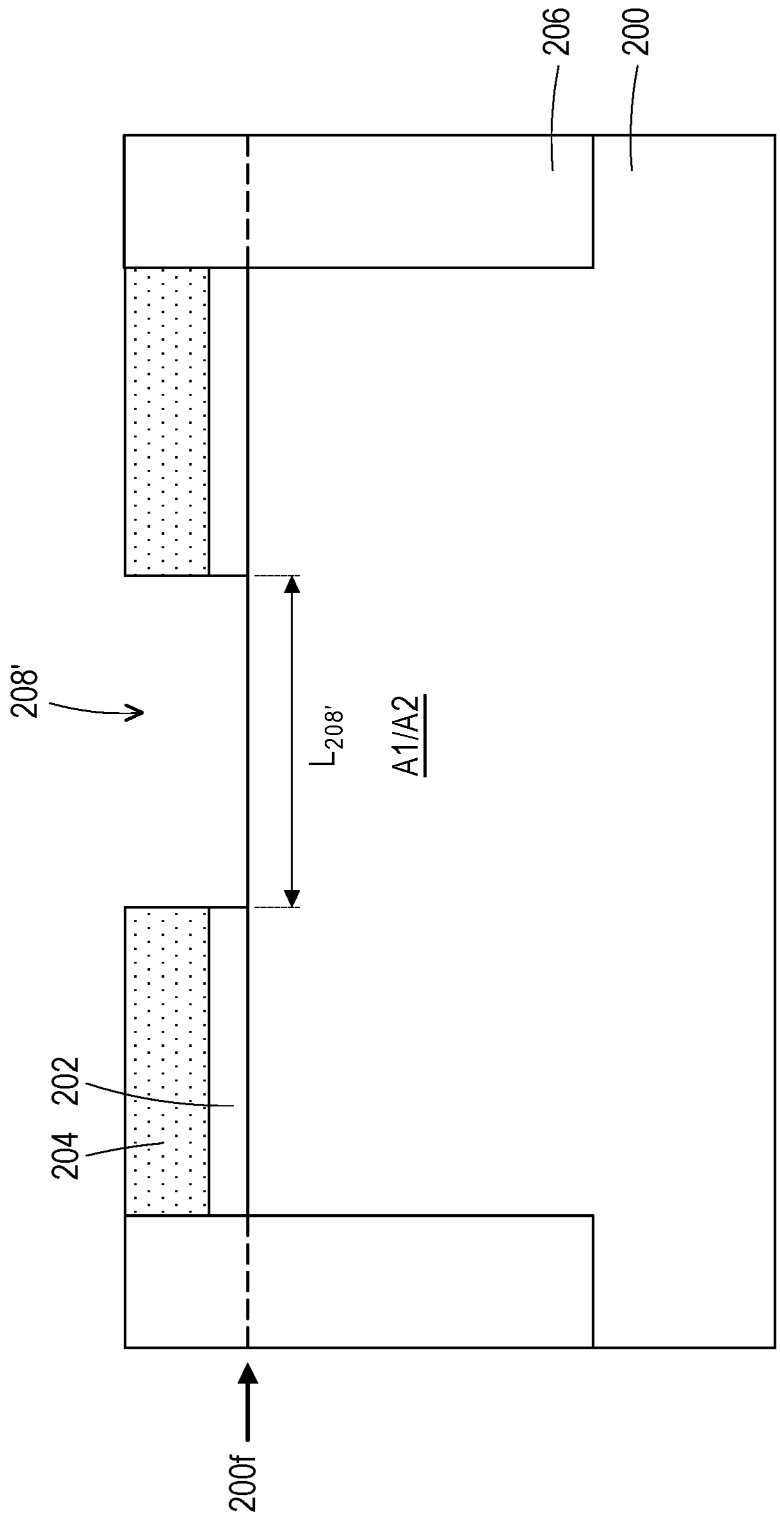
FIG. 5A through FIG. 5C are cross-sectional views illustrating a series of intermediate structures during a process for forming a transistor structure, according to some embodiments of the present disclosure.
Figure 5B:
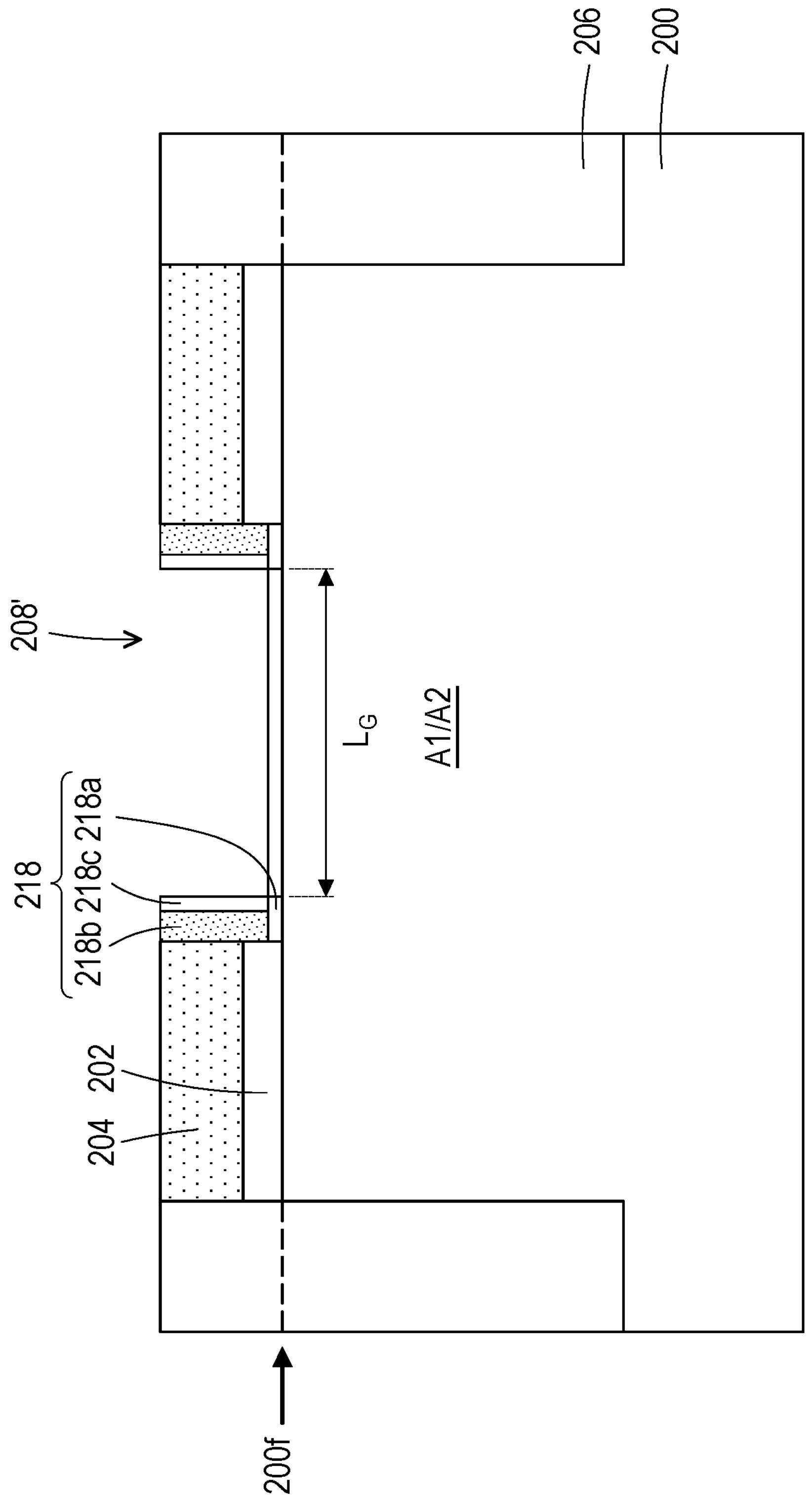
Figure 5C:
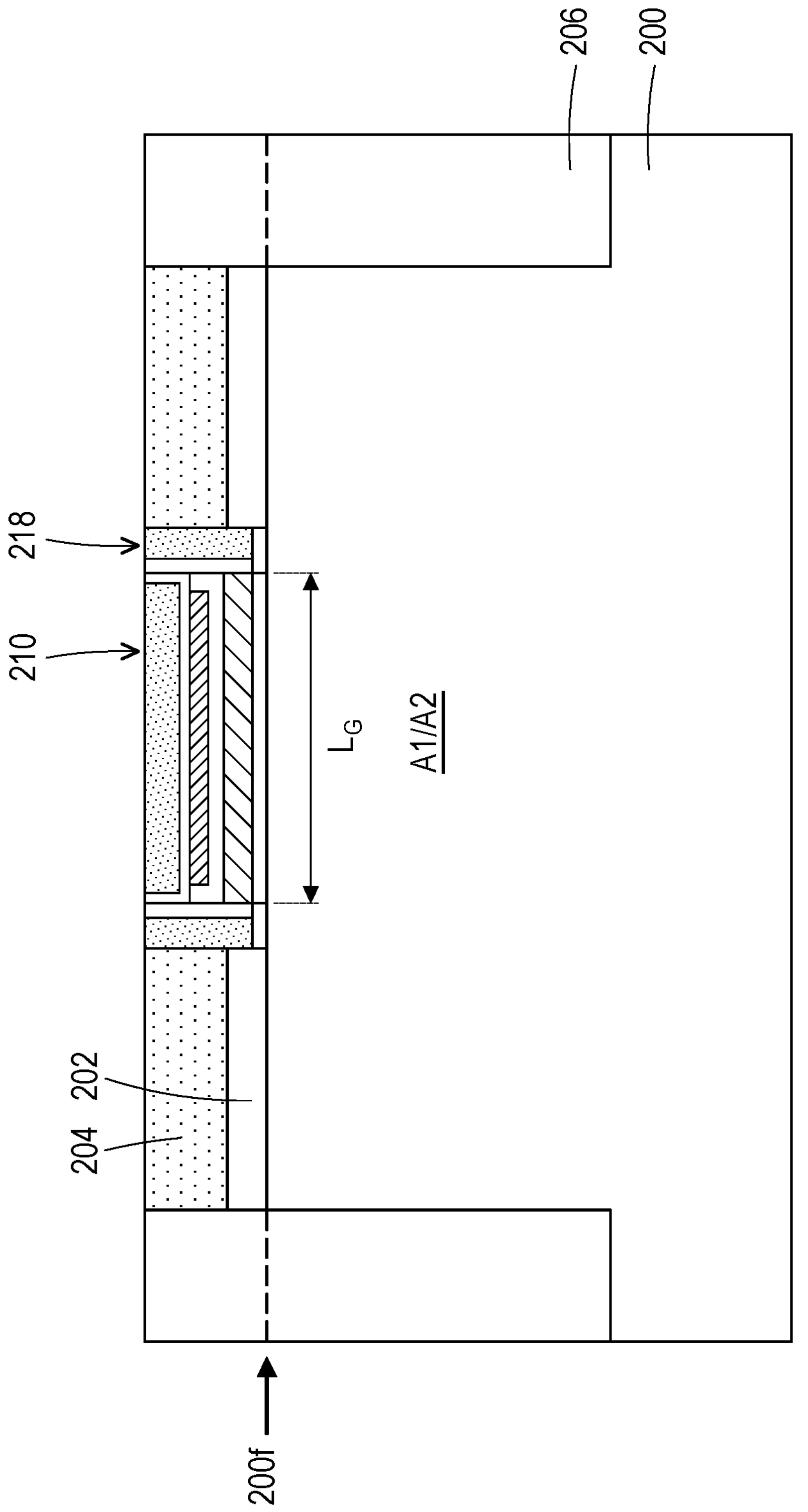

FIG. 5A through FIG. 5C are cross-sectional views illustrating a series of intermediate structures during a process for forming a transistor structure, according to some embodiments of the present disclosure. It should be appreciated that, these intermediate structures can be processed to form a PMOS or an NMOS of the transistor structure.

The transistor structure manufacture process may begin with the step S100 as described with reference to FIG. 1, FIG. 2A and FIG. 2B. Thereafter, as shown in FIG. 5A, gate openings 208' are formed through the pad layers 202, 204. As a difference from the gate openings 208 described with reference to FIG. 2C and FIG. 2D, the gate openings 208' may be formed with a length L 208 ' greater than the gate length L G of the gate structures 210 to be filled in the gate openings 208'.

Afterwards, as shown in FIG. 5B, the gate spacers 218 are formed along sidewalls of the gate openings 208' shared with the pad layers 202, 204. In order to reserve space for the subsequently formed gate structures 210, the gate spacers 218 in each gate opening 208' are laterally separated by a spacing in between, and a length of such spacing is controlled to be substantially equal to the gate length $L_G$.

As described with reference to FIG. 2J, each gate spacer 218 may include the bottom layer 218*a*, the first sidewall spacer 218*b* and the second sidewall spacer 218*c*. In the embodiments described with reference to FIG. 5A through FIG. 5C, the first sidewall spacers 218*b* may extend along the sidewalls of the pad layers 202, 204, while the second sidewall spacers 218*c* may be in lateral contact with the pad layers 202, 204 through the first sidewall spacers 218*b*, and the bottom layers 218*a* may lie under the first and second sidewall spacers 218*b*, 218*c*.

Subsequently, as shown in FIG. 5C, the gate structures 210 are filled in the gate openings 208'. Specifically, each gate structure 210 is filled in the spacing between the gate spacers 218 in one of the gate openings 208'. In this way, dimensions of each gate structure 210 are defined by the accommodating spacing. For instance, as described, the gate length L G of each gate structure 210 is substantially identical with the length of the accommodating spacing.

Thereafter, the steps S106, S108, S110, S112, S114, S116 described with reference to FIG. 1 and FIG. 2G through FIG. 2R may be performed in order. Optionally, after the step S114 for exposing growth planes of the source/drain structures 230, the growth planes may be further shaped to be curved or depressed surfaces (i.e., the curved or depressed sidewalls CS described with reference to FIG. 4). Moreover, the resulted PMOS may be further covered by the strained etching stop layer 232 with compressive stressors (as described with reference to FIG. 2S and FIG. 2T). On the other hand, the resulted NMOS may be further processed to have dislocation stressors in the resulted source/drain structures 230' (as described with reference to FIG. 3H), and/or may be covered by the strained etching stop layer 234 with tensile stressors (as described with reference to FIG. 2S and FIG. 2T).

Furthermore, at an advanced technology node, the PMOS and NOMS can each be implemented by a fin-type field effect transistor (FinFET).

FIG. 6A through FIG. 6G are cross-sectional views illustrating a series of intermediate structures during a process for forming a transistor structure, according to some embodiments of the present disclosure. Specifically, these intermediate structures are processed to form a fin-type PMOS or a fin-type NMOS in the transistor structure.

Initially, a semiconductor substrate 600 may be shaped to form fin structures FN. FIG. 6A through FIG. 6G are cross-sectional views cut along one of the fin structures FN. As the fin structures FN are defined, a trench isolation structure 602 may be formed around the fin structures FN. In some embodiments, the trench isolation structure 602 may be recessed to a height lower than top surfaces of the fin structures FN.

Figure 6A:
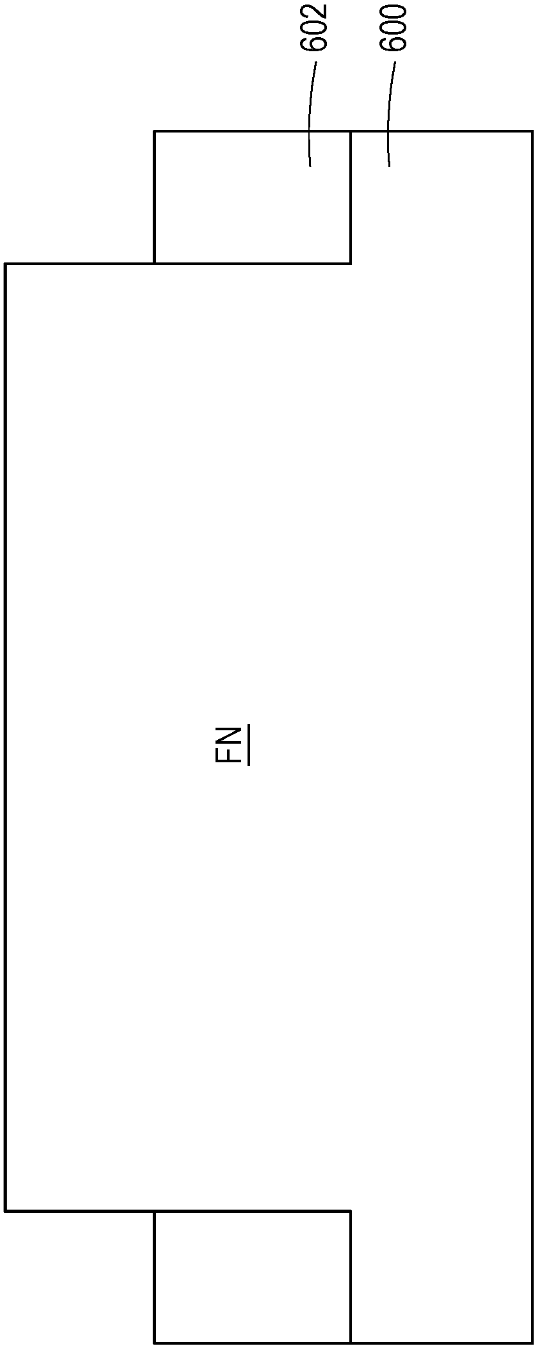
FIG. 6A through FIG. 6G are cross-sectional views illustrating a series of intermediate structures during a process for forming a transistor structure, according to some embodiments of the present disclosure.
Figure 6B:
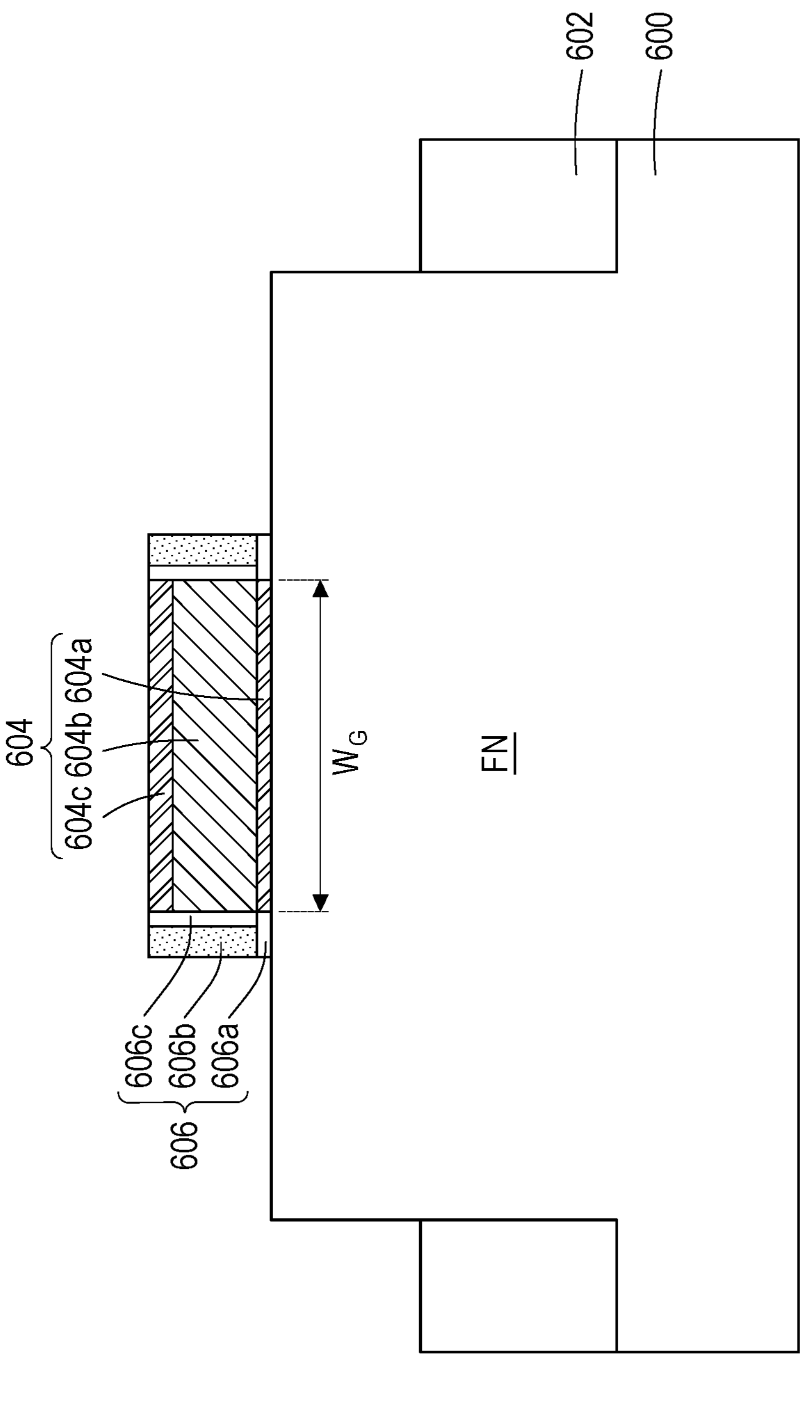

Thereafter, as shown in FIG. 6B, dummy gate structures 604 and gate spacers 606 are formed. The dummy gate structures 604 having a width W G cross the fin structures FN, such that each fin structure FN is in contact with the intersecting dummy gate structure 604 by a top surface and opposite sidewalls. According to some embodiments, the dummy gate structures 604 respectively include a dummy gate dielectric layer 604*a*, a dummy gate electrode 604*b* stacked on the dummy gate dielectric layer 604*a* and a hard mask layer 604*c* covering the dummy gate electrode 604*b*. On the other hand, the gate spacers 606 are formed along sidewalls of the dummy gate structures 604. As similar to the gate spacers 218 described with reference to FIG. 2J, the gate spacers 606 may respectively include a bottom layer 606*a*, a first sidewall spacer 606*b* and a second sidewall spacer 606*c*. The first sidewall spacers 606*b* may cover the sidewalls of the dummy gate structures 604; the second sidewall spacers 606*c* may be in lateral contact with the dummy gate structures 604 through the first sidewall spacers 606*b*; and the bottom layers 606*a* lie below the first and second sidewall spacers 606*b*, 606*c*.

Figure 6C:
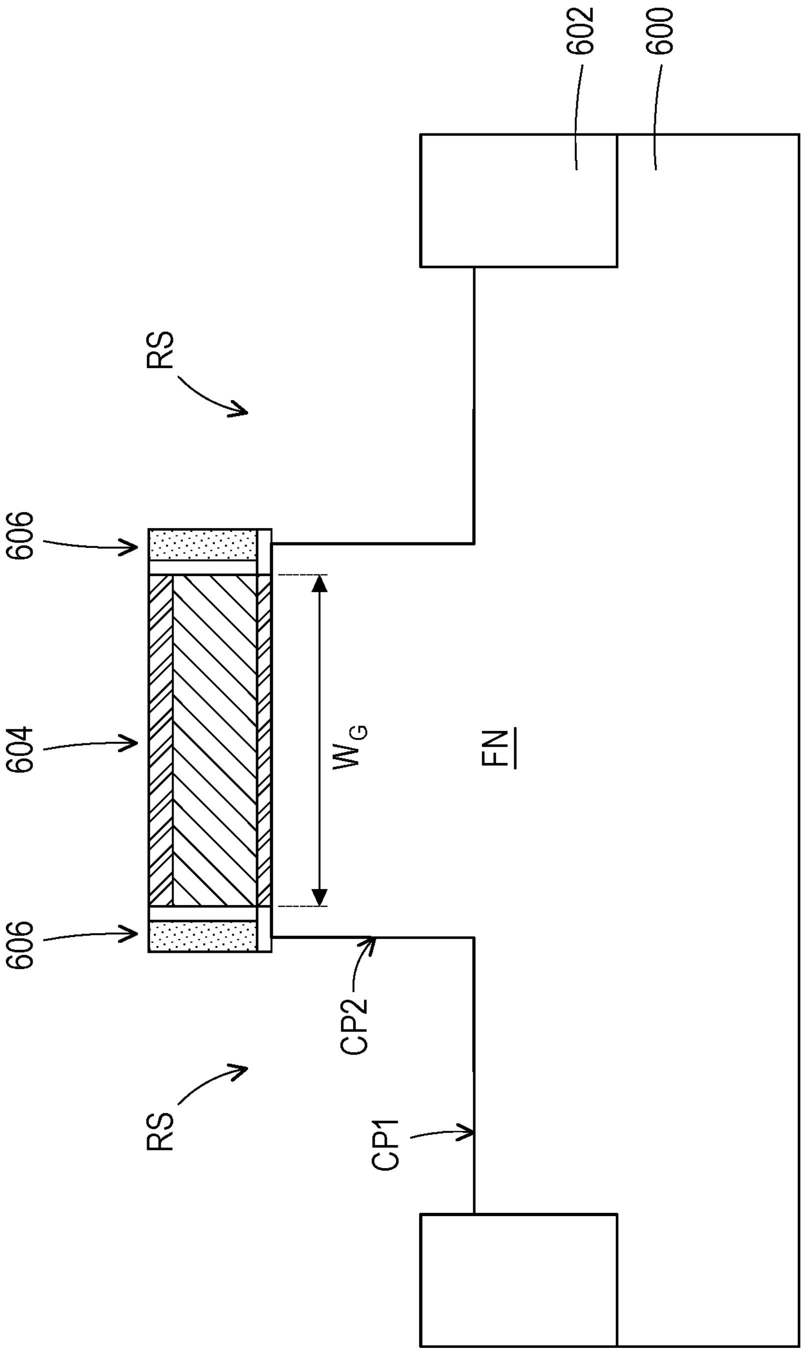

As shown in FIG. 6C, then portions of the fin structures FN not shielded by the dummy gate structures 604 and the gate spacers 606 are recessed. The resulted recesses RS respectively have a bottom surface defined by the crystalline plane CP1 and a sidewall defined by the crystalline plane CP2. According to some embodiments, the sidewalls of the recesses RS (i.e., the crystalline planes CP2) are laterally recessed with respect to outer sidewalls of the gate spacers 606. In alternative embodiments, the sidewalls of the recesses RS are substantially aligned with the outer sidewalls of the gate spacers 606.

Figure 6D:
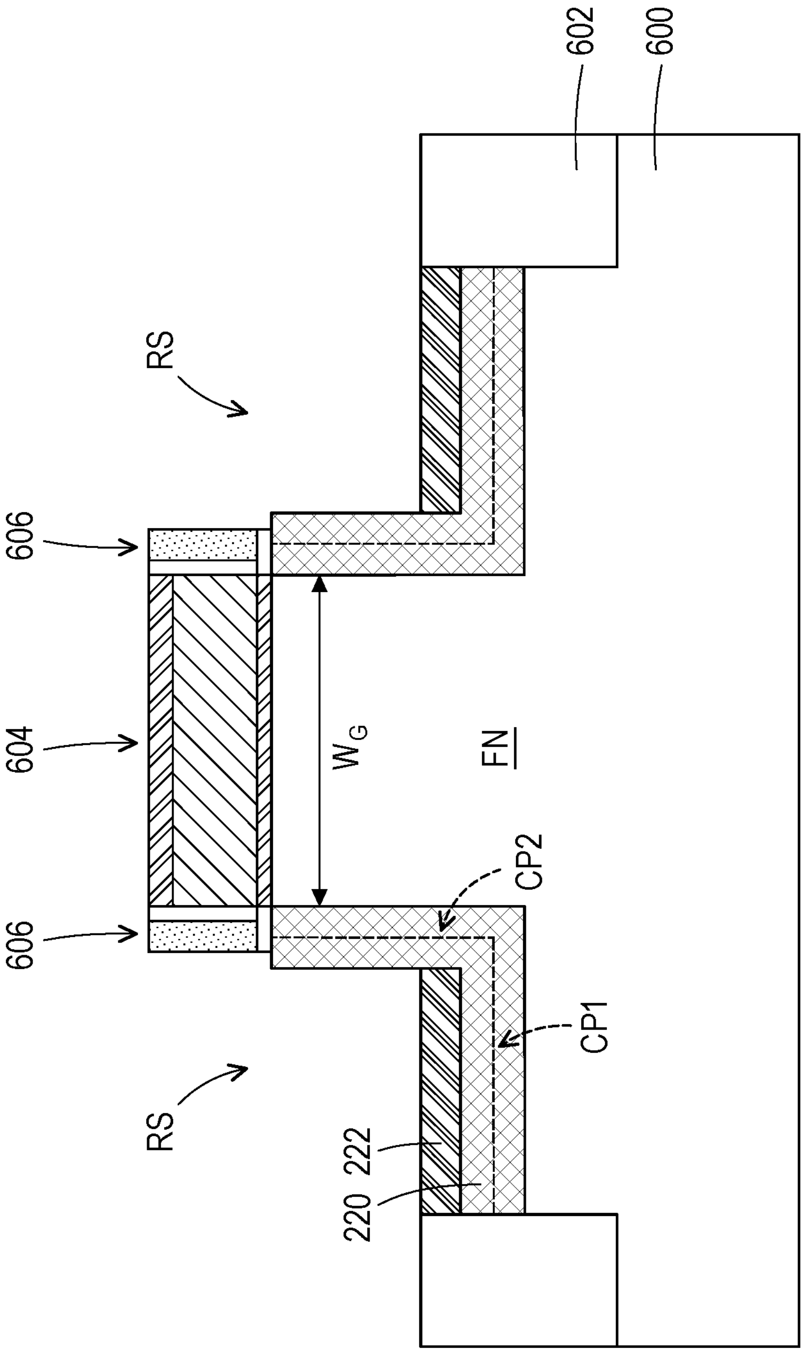

Subsequently, as shown in FIG. 6D, the localized isolation layer 220 and the localized isolation layer 222 are formed in each of the recesses RS. As described with reference to FIG. 2N, the localized isolation layer 220 in each recess RS is formed along the exposed crystalline planes CP1, CP2. Since the localization layers 220 laterally spans into the fin structures FN from the crystalline planes CP2, portions of the fin structures FN right below the dummy gate structures 604 and the gate spacers 606 are laterally recessed. By controlling growth of the localized isolation layers 220, these portions of the fin structures FN can be each recessed until its sidewalls are substantially aligned with the sidewalls of the overlying dummy gate structure 604. In this way, these portions of the fin structures FN are each narrowed until its width is reduced to the width W G of the overlying dummy gate structure 604.

On the other hand, in each recess RS, the localized isolation layer 222 lies on a portion of the localized isolation layer 220 formed along the crystalline plane CP1. Portions of the localized isolation layers 220 formed along the crystalline planes CP2 are not entirely covered by the localized isolation layers 222, but protruded from the localized isolation layers 222 and thus partially exposed.

Figure 6E:
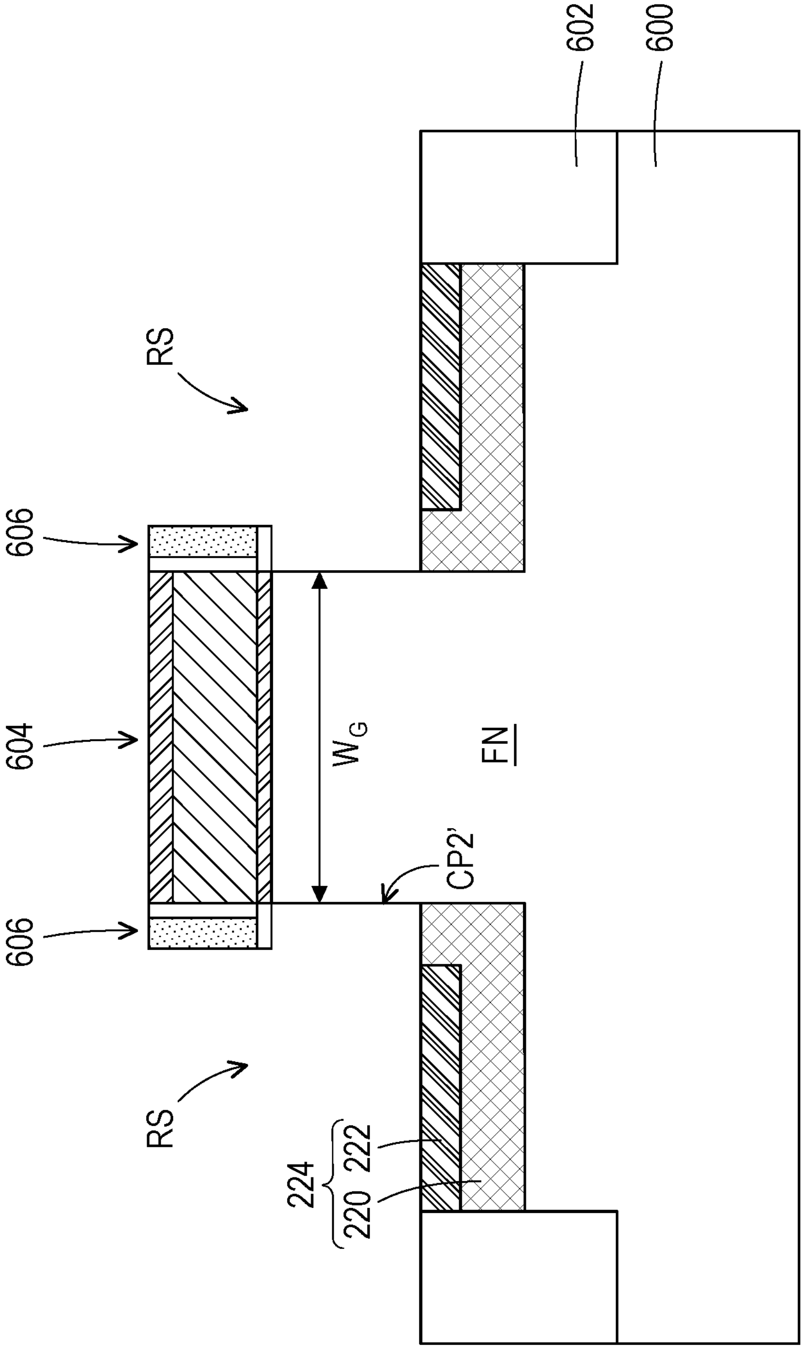

As shown in FIG. 6E, the exposed portions of the localized isolation layers 220 are then removed. Consequently, as similar to the result described with reference to FIG. 2P, sidewalls of the fin structures FN accurately aligned with the sidewalls of the dummy gate structures 604 are exposed. The exposed sidewalls of the fin structures FN are formed by the vertically spanning crystalline planes CP2', which are identical with the vertically spanning crystalline planes CP2, but are more laterally recessed with respect to the outer sidewalls of the gate spacers 606. As described with reference to FIG. 2P, remained portions of the localized isolation layer 220 and the covered localized isolation layer 222 in each recess RS are collectively referred to as one of the buried isolation structures 224.

Figure 6F:
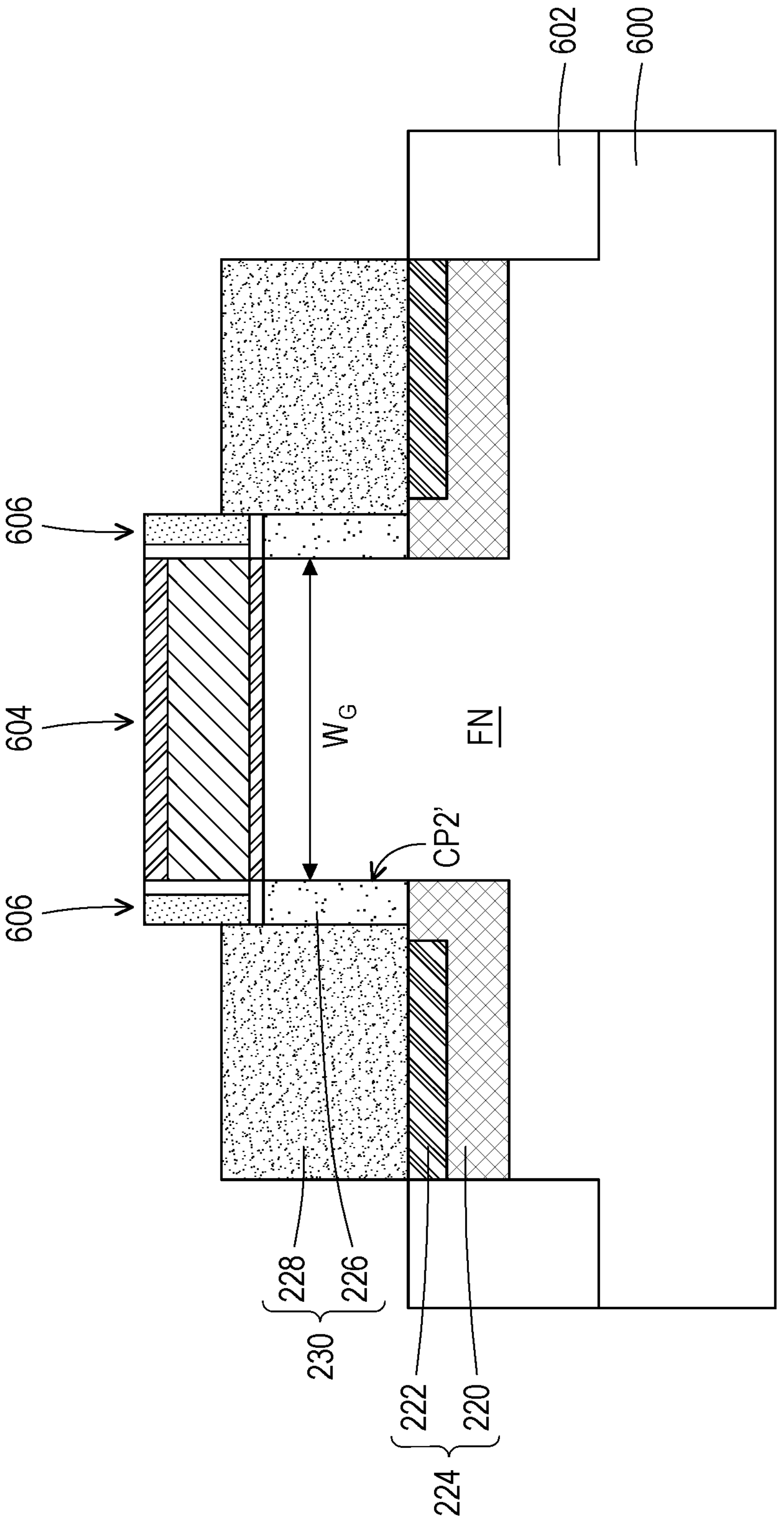

Afterwards, as shown in FIG. 6F, the semiconductor regions 226, 228 are grown from the crystalline planes CP2'. As similar to the result described with reference to FIG. 2R, the semiconductor regions 226 are formed along the crystalline planes CP2', and the semiconductor regions 228 are grown from the semiconductor regions 226, to entirely cover the buried isolation structures 224. In some embodiments, the semiconductor regions 228 are grown to a height over top ends of the semiconductor regions 226, and are in lateral contact with the gate spacers 606. Each semiconductor region 228 and the adjacent one of the semiconductor regions 226 are collectively referred to as one of the source/drain structures 230.

Figure 6G:
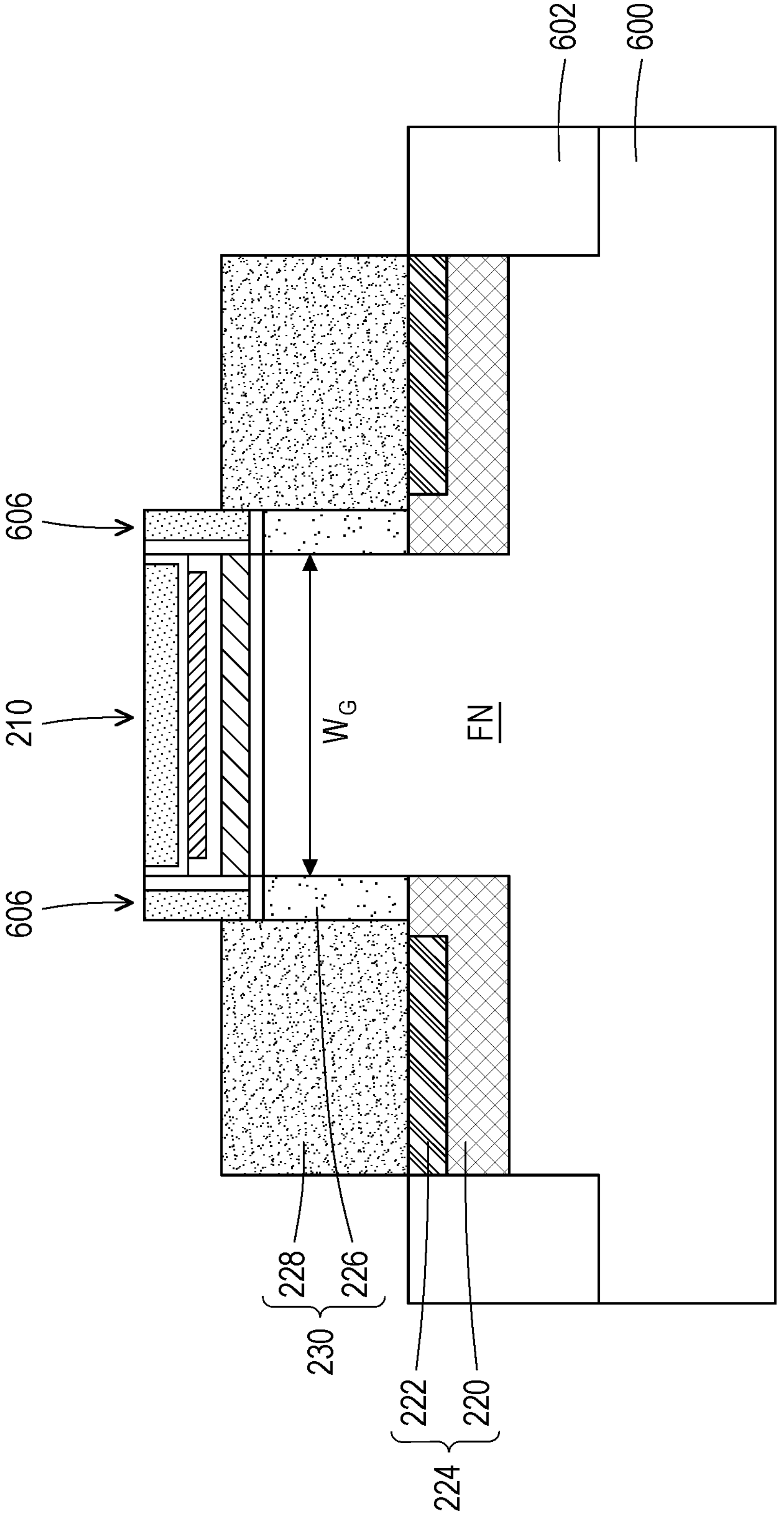

Thereafter, as shown in FIG. 6G, the dummy gate structures 604 are replaced with the gate structures 210. Prior to the replacement, a dielectric layer (not shown) may be formed to cover components other than the dummy gate structures 604 and the gate spacers 606. Then, the dummy gate structures 604 are removed to form recesses between the gate spacers 606, and the gate structures 210 are filled in these recesses, respectively.

Although not shown, the resulted FinFET with a P-type channel may be further covered by the strained etching stop layer 232 with compressive stressors, as described with reference to FIG. 2S and FIG. 2T. On the other hand, the resulted FinFET with an N-type channel may be further processed to have dislocation stressors in the resulted source/drain structures 230', and or may be further covered by the strained etching stop layer 234 with tensile stressors (as described with reference to FIG. 2S and FIG. 2T).

Furthermore, after the step for exposing the growth planes of the source/drain structures 230 (i.e., the crystalline planes CP2'), the growth planes may be optionally shaped to be curved or depressed surfaces, as described with reference to FIG. 4.

As above, by forming the buried isolation structures 224 before formation of the source/drain structures 230, growth planes substantially aligned with edges of the gate structures 210 can be provided for the source/drain structures 230. Therefore, in each of the resulted PMOS and NMOS, a channel length between the source/drain structures 230 can be accurately defined to be substantially equal to a distance between opposite edges of the gate structure 210 (i.e., the gate length L G or the gate width W G). In this way, it is no longer required to reserve a long channel length for minimizing SCE. In addition, as the buried isolation structures 224 shield bottom surfaces of the recesses for accommodating the source/drain structures 230, the source/drain structures 230 can be each grown from a single crystalline plane (i.e., the crystalline plane CP2'). Therefore, great crystalline quality of the source/drain structures 230 can be promised, and the source/drain structures 230 can be formed with planar top surfaces, which may result in lower contact resistance between the source/drain structures 230 and contact structures landing on the source/drain structures 230. Further, as the buried isolation structures 224 are formed along bottom sides of the source/drain structures 230, junctions would not be formed along the bottom sides of the source/drain structures 230. Therefore, longer latch-up paths are resulted without increasing isolation width between the PMOS and the NMOS. Consequently, latch-up leakage can be effectively prevented without further spacing apart the PMOS and the NMOS. On top of that, operation performance of the PMOS and the NMOS can be enhanced by one or both of the described strain engineering approaches. Specifically, carrier mobility of the PMOS can be increased as compressive stress is provided to channel region from the strained etching stop layer 232 covering the PMOS. On the other hand, carrier mobility of the NMOS can be increased as (longitudinal) tensile stress is provided to channel region from the strained etching stop layer 234 covering the NMOS and/or the dislocation stressors formed in the source/drain structures 230' of the NMOS.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A transistor structure, comprising:
a first transistor device, formed on a first active region of a semiconductor substrate, and comprising:
a first gate structure, disposed on the first active region;
first gate spacers, formed along opposite sidewalls of the first gate structure;
first source/drain structures, formed in recesses of the first active region at opposite sides of the first gate structure;
first buried isolation structures, separately extending along bottom sides of the first source/drain structures; and
a first strained etching stop layer, covering the first source/drain structures, the first gate spacers and the first gate structure, and formed with tensile or compressive stressors, wherein
the first source/drain structures respectively comprise a first semiconductor region and a second semiconductor region,
the first semiconductor region is in lateral contact with a sidewall of one recess,
the second semiconductor region laterally extends from the first semiconductor region,
a doping concentration in the first semiconductor region is lower than a doping concentration in the second semiconductor region,
a bottom of the first semiconductor region and a bottom of the second semiconductor region contact the first buried isolation structure, and
the bottom of the first semiconductor region and the bottom of the second semiconductor region are isolated from the semiconductor substrate by the first buried isolation structure.

2. The transistor structure according to claim 1, wherein the first source/drain structures are in lateral contact with straight sidewalls of the recesses that are substantially aligned with the sidewalls of the first gate structure.

3. The transistor structure according to claim 1, wherein the first source/drain structures are grown from curved or depressed sidewalls of the recesses.

4. The transistor structure according to claim 1, wherein the first active region is a fin structure defined at a top surface of the semiconductor substrate, and the first gate structure crosses the first active region, such that the first active region is in contact with the first gate structure by a top surface and opposite sidewalls.

5. The transistor structure according to claim 1, wherein the first buried isolation structures respectively comprise a first localized isolation layer and a second localized isolation layer, the first localized isolation layer lies under the second localized isolation layer, and further extends to be in lateral contact with an edge of the second localized isolation layer and in contact with the overlying one of the first source/drain structures from below.

6. The transistor structure according to claim 1, wherein each of the first source/drain structures is grown from a single crystalline plane of the first active region.

7. The transistor structure according to claim 1, wherein the first transistor device is an N-type MOSFET, the first strained etching stop layer is formed with tensile stressors, and the transistor structure further comprises:
a second transistor device as a P-type MOSFET, formed on a second active region of the semiconductor substrate, and comprising:
a second gate structure;
second gate spacers, formed along opposite sidewalls of the second gate structure;
second source/drain structures, formed in recesses of the second active region at opposite sides of the second gate structure;
second buried isolation structures, formed in the second active region, and separately extending along bottom sides of the second source/drain structures; and
a second strained etching stop layer, covering the second source/drain structures, the second gate spacers and the second gate structure, and formed with compressive stressors.

8. The transistor structure according to claim 7, wherein the first and second strained etching stop layers are both formed of silicon nitride.

9. The transistor structure according to claim 7, further comprising:
a trench isolation structure, formed into the semiconductor substrate, and laterally surrounding each of the first and second active regions.

10. The transistor structure according to claim 9, wherein a top surface of the trench isolation structure is higher than topmost surfaces of the first and second active regions.

11. A transistor structure, comprising:
a transistor device, formed on an active region of a semiconductor substrate, and comprising:
a gate structure;
gate spacers, formed along opposite sidewalls of the gate structure;
source/drain structures, filled in recesses of the active region at opposite sides of the gate structure, and respectively comprising a first semiconductor region and a second semiconductor region, wherein the first semiconductor region is in lateral contact with a sidewall of one recess and the second semiconductor region laterally extends from the first semiconductor region and is formed with dislocation stressors; and
buried isolation structures, formed along bottom sides of the recesses, and are laterally separated from each other, wherein
a doping concentration in the first semiconductor region is lower than a doping concentration in the second semiconductor region, and
a bottom of the first semiconductor region and a bottom of the second semiconductor region contact the buried isolation structure.

12. The transistor structure according to claim 11, wherein the dislocation stressors result in tensile stress or compressive stress in a channel portion of the active region between the source/drain structures.

13. The transistor structure according to claim 11, further comprising:
a shallow trench isolation structure, located in the semiconductor substrate, and surrounding the transistor device, wherein a top of the trench isolation structure is higher than tops of the source/drain structures.

* * * * *